United States Patent
Shu et al.

(10) Patent No.: US 11,349,035 B2
(45) Date of Patent: *May 31, 2022

(54) SEMICONDUCTOR DEVICE INCLUDING NON-VOLATILE MEMORY CELLS

(71) Applicant: TAIWAN SEMICONDUCTOR MANUFACTURING CO., LTD., Hsinchu (TW)

(72) Inventors: Cheng-Bo Shu, Tainan (TW); Yun-Chi Wu, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,509

(22) Filed: Jun. 22, 2020

(65) Prior Publication Data
US 2020/0321476 A1 Oct. 8, 2020

Related U.S. Application Data

(60) Continuation of application No. 16/201,358, filed on Nov. 27, 2018, now Pat. No. 10,693,018, which is a
(Continued)

(51) Int. Cl.
*H01L 29/792* (2006.01)
*H01L 27/1157* (2017.01)
(Continued)

(52) U.S. Cl.
CPC ........ *H01L 29/792* (2013.01); *H01L 27/1157* (2013.01); *H01L 27/1237* (2013.01);
(Continued)

(58) Field of Classification Search
CPC ............... H01L 29/792; H01L 29/4234; H01L 29/40117; H01L 29/0673; H01L 29/42392;
(Continued)

(56) References Cited

U.S. PATENT DOCUMENTS 7,259,422 B1 8/2007 Hisamoto et al.
7,452,778 B2 11/2008 Chen et al.
(Continued)

FOREIGN PATENT DOCUMENTS

CN 101414631 A 4/2009
CN 101675502 A 3/2010
(Continued)

OTHER PUBLICATIONS

Notice of Allowance of Patent issued in corresponding Korean Application No. 10-2017-0129876, dated Sep. 18, 2019, with English translation.
(Continued)

*Primary Examiner* — Quoc D Hoang
(74) *Attorney, Agent, or Firm* — McDermott Will & Emery LLP

(57) ABSTRACT

A semiconductor device includes a non-volatile memory (NVM) cell. The NVM cell includes a semiconductor wire disposed over an insulating layer disposed on a substrate. The NVM cell includes a select transistor and a control transistor. The select transistor includes a gate dielectric layer disposed around the semiconductor wire and a select gate electrode disposed on the gate dielectric layer. The control transistor includes a stacked dielectric layer disposed around the semiconductor wire and a control gate electrode disposed on the stacked dielectric layer. The stacked dielectric layer includes a charge trapping layer. The select gate
(Continued)

electrode is disposed adjacent to the control gate electrode with the stacked dielectric layer interposed therebetween.

20 Claims, 30 Drawing Sheets

Related U.S. Application Data division of application No. 15/644,506, filed on Jul. 7, 2017, now Pat. No. 10,276,728.

(51) Int. Cl.
| | |
|---|---|
| *H01L 29/06* | (2006.01) |
| *H01L 29/423* | (2006.01) |
| *H01L 29/786* | (2006.01) |
| *H01L 29/66* | (2006.01) |
| *H01L 21/28* | (2006.01) |
| *H01L 27/12* | (2006.01) |
| *H01L 29/78* | (2006.01) |

(52) U.S. Cl.
CPC .... *H01L 29/0673* (2013.01); *H01L 29/40117* (2019.08); *H01L 29/4234* (2013.01); *H01L 29/42392* (2013.01); *H01L 29/66742* (2013.01); *H01L 29/66833* (2013.01); *H01L 29/78696* (2013.01); *H01L 29/66795* (2013.01); *H01L 29/785* (2013.01)

(58) Field of Classification Search
CPC ......... H01L 29/78696; H01L 29/66742; H01L 29/66833; H01L 29/785; H01L 29/66795; H01L 27/1237; H01L 27/1157
See application file for complete search history.

(56) References Cited

U.S. PATENT DOCUMENTS

| | | | |
|---|---|---|---|
| 7,872,298 B2 | 1/2011 | Shimamoto et al. | |
| 8,273,626 B2 | 9/2012 | Hareland et al. | |
| 8,749,026 B2 | 6/2014 | Shah et al. | |
| 8,785,909 B2 | 7/2014 | Radosavljevic et al. | |
| 8,895,397 B1 | 11/2014 | Shum et al. | |
| 9,076,722 B2 | 7/2015 | Sakuma et al. | |
| 9,129,829 B2 | 9/2015 | Kuhn et al. | |
| 9,257,554 B2 | 2/2016 | Shum et al. | |
| 10,276,728 B2 * | 4/2019 | Shu ................... H01L 29/66742 |
| 2005/0275010 A1 | 12/2005 | Chen et al. | |
| 2006/0172497 A1 | 8/2006 | Hareland et al. | |
| 2007/0164344 A1 | 7/2007 | Park et al. | |
| 2009/0101967 A1 * | 4/2009 | Lai ........................ H01L 29/775 |
| | | | 257/326 |
| 2010/0226195 A1 | 9/2010 | Lue | |
| 2013/0119455 A1 | 5/2013 | Chen et al. | |
| 2013/0270512 A1 | 10/2013 | Radosavljevic et al. | |
| 2014/0048867 A1 | 2/2014 | Toh et al. | |
| 2015/0048439 A1 | 2/2015 | Shum et al. | |
| 2016/0300959 A1 | 10/2016 | Jenne et al. | |

FOREIGN PATENT DOCUMENTS

| | | |
|---|---|---|
| CN | 104332471 A | 2/2015 |
| EP | 1639652 B1 | 1/2013 |
| KR | 10-2012-0085928 A | 8/2012 |
| KR | 10-2013-0108410 A | 10/2013 |
| KR | 10-2014-0024210 A | 2/2014 |
| KR | 10-2015-0034232 A | 4/2015 |
| KR | 10-2015-0134887 A | 12/2015 |
| KR | 10-2016-0137691 A | 11/2016 |
| TW | 200610004 A | 3/2006 |

OTHER PUBLICATIONS

Notice of Allowance issued in corresponding U.S. Appl. No. 16/201,358, dated Feb. 20, 2020.

* cited by examiner

SEMICONDUCTOR DEVICE INCLUDING NON-VOLATILE MEMORY CELLS

CROSS-REFERENCE TO RELATED APPLICATIONS

This application is a continuation of U.S. patent application Ser. No. 16/201,358 filed Nov. 27, 2018, which is a divisional application of U.S. patent application Ser. No. 15/644,506, filed on Jul. 7, 2017, now U.S. Pat. No. 10,276,728, the entire disclosures of each of which are incorporated herein by reference.

TECHNICAL FIELD

The disclosure relates to method of manufacturing semiconductor integrated circuits, and more particularly to a semiconductor device including a non-volatile memory and a method of manufacturing the same.

BACKGROUND

As the semiconductor industry has progressed into nanometer technology process nodes in pursuit of higher device density, higher performance, and lower costs, challenges from both fabrication and design issues have resulted in the development of three-dimensional designs. Integration of a non-volatile memory in a semiconductor device has achieved a higher functionality of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

In some embodiments, a semiconductor device includes non-volatile memory (NVM) cells, such as a semiconductor-oxide-nitride-oxide-semiconductor (SONOS) type NVM cell. In particular, the present embodiments are directed to a 1.5-transistor (1.5 T) SONOS NVM cell utilizing a gate-all-around structure.

Figure 1A:
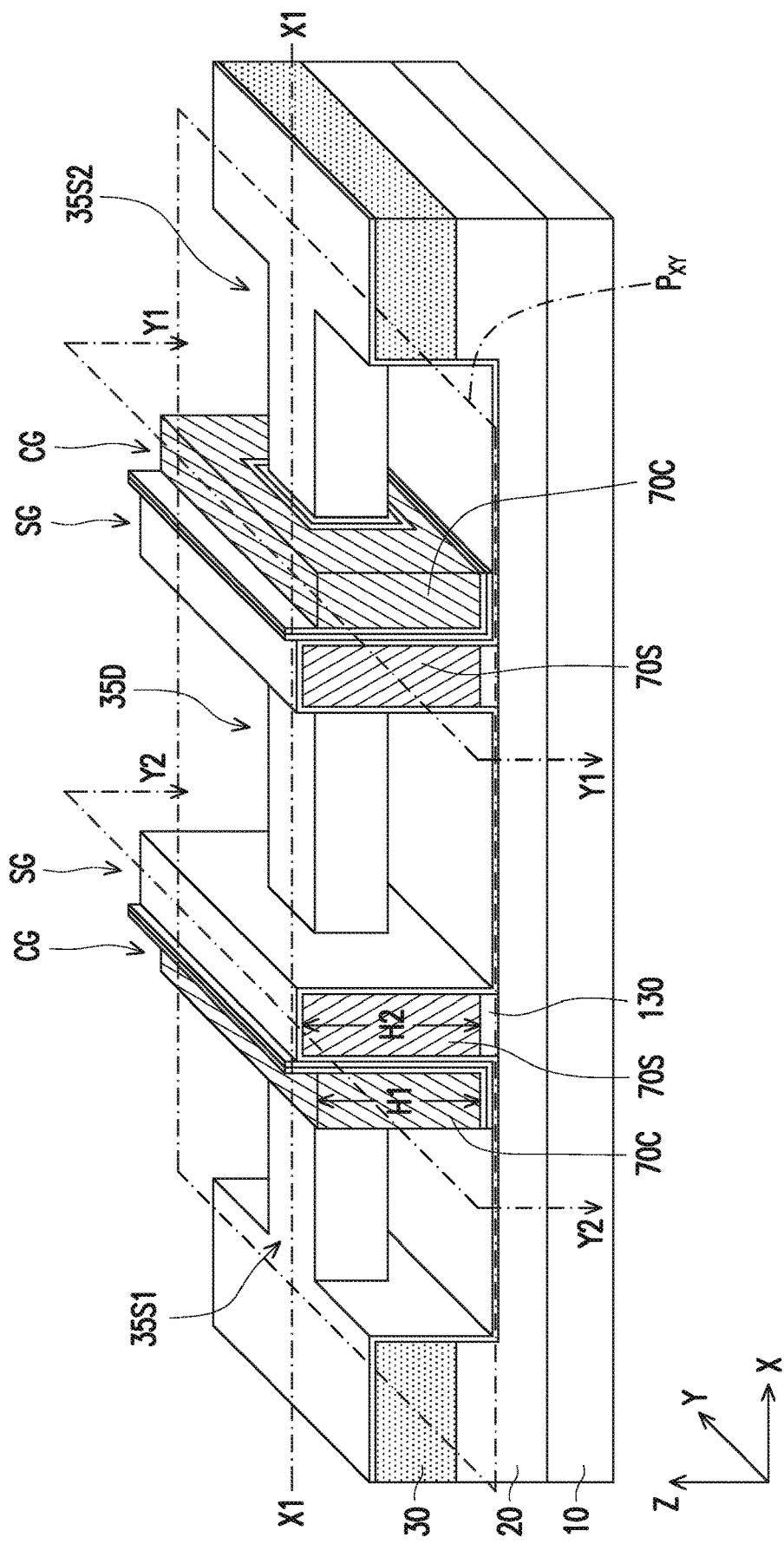
FIG. 1A is a perspective view of a non-volatile memory cell in accordance with embodiments of the present disclosure.
Figure 1B:
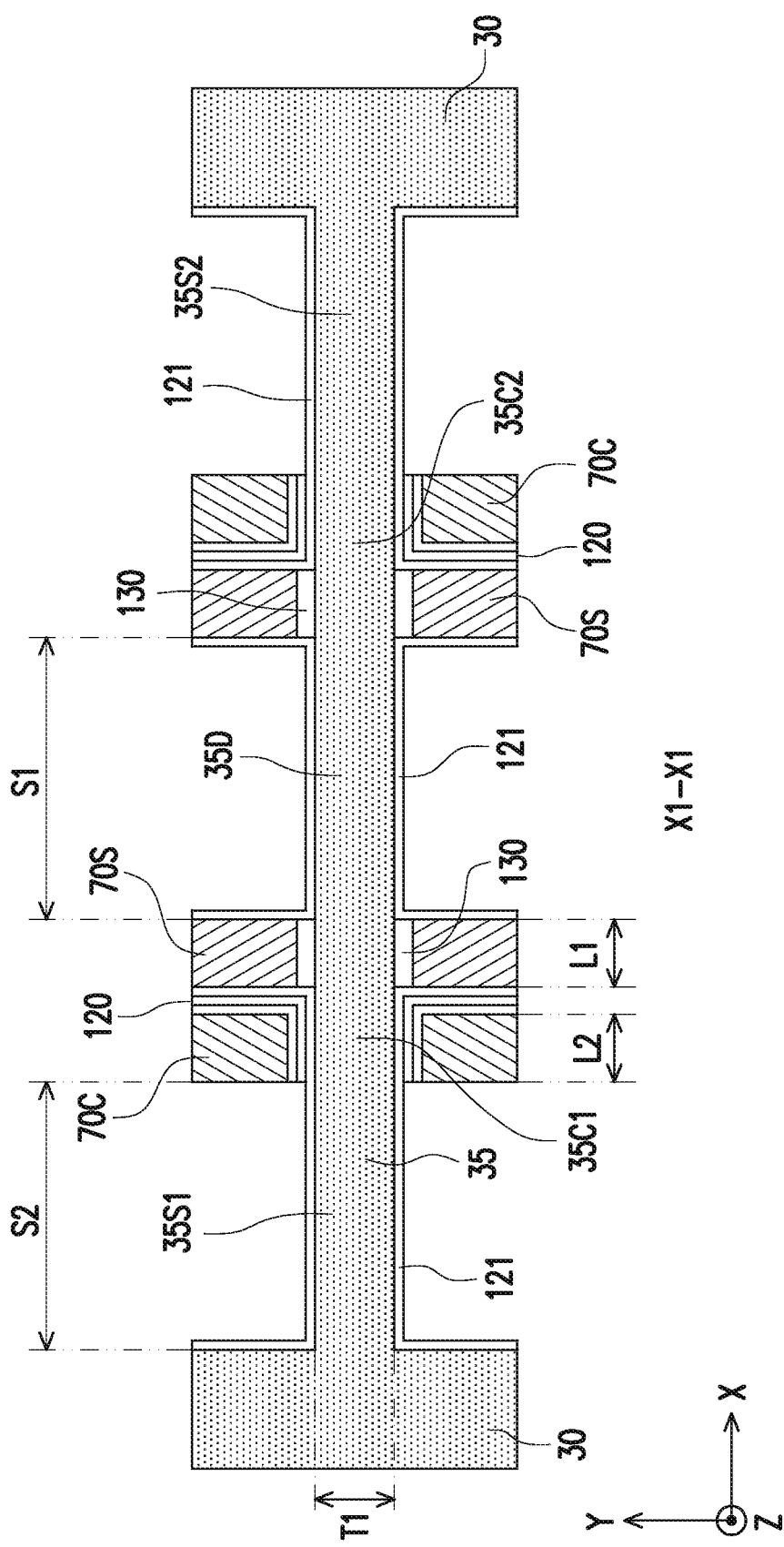
FIG. 1B is a cross sectional view corresponding to the plane $P_{XY}$ along X1-X1 line of FIG. 1A.
Figure 1C:
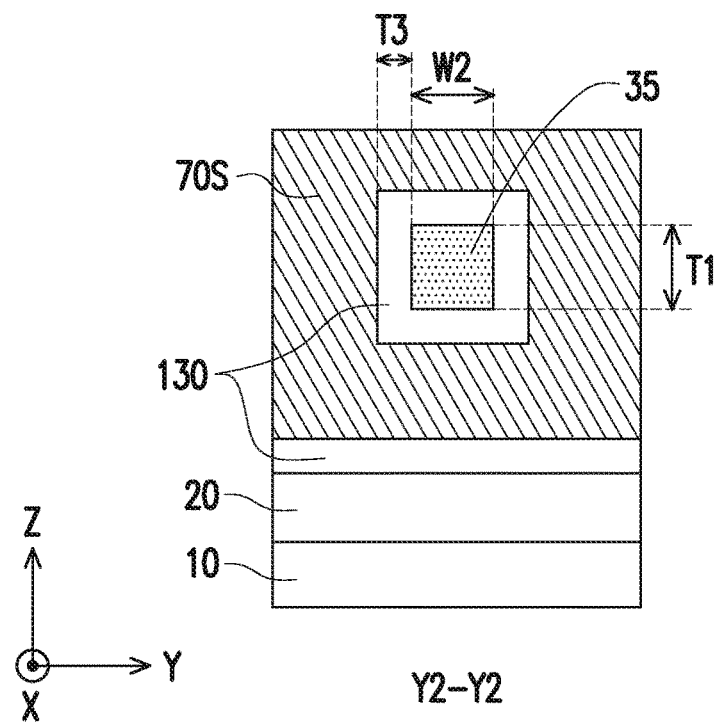
FIG. 1C is a cross sectional view corresponding to line Y2-Y2 of FIG. 1A
Figure 1D:
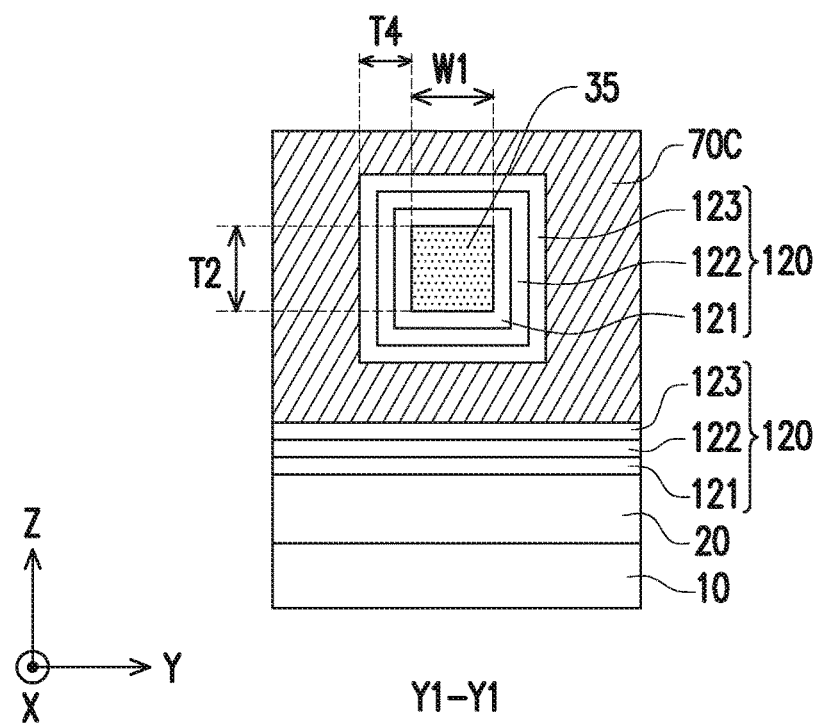
FIG. 1D is a cross sectional view corresponding to line Y1-Y1 of FIG. 1A.

FIGS. 1A-1D illustrate a structure of a 1.5 T SONOS NVM cell in accordance with some embodiments of the present disclosure. FIG. 1B is a cross sectional view corresponding to the plane $P_{XY}$ along X1-X1 line of FIG. 1A, FIG. 1C is a cross sectional view corresponding to line Y2-Y2 of FIG. 1A and FIG. 1D is a cross sectional view corresponding to line Y1-Y1 of FIG. 1A.

As shown in FIGS. 1A-1D, the 1.5 T SONOS NVM cell includes two pairs of a control transistor CG and a select transistor SG, both of which are GAA FETs. These transistors are disposed over an insulating layer 20 disposed on a substrate 10. Since two memory cells shares one drain, the device of FIGS. 1A-1D is a 1.5 T NVM device.

The select transistor SG includes a semiconductor wire 35 extending in the X direction, a gate dielectric layer 130 wrapping around a part of the semiconductor wire (channel) 35C1 or 35C2, and a select gate (SG) electrode 70S formed on the gate dielectric layer 130 wrapping around the part of the semiconductor wire 35C1 or 35C2. In some embodiments, the gate dielectric layer 130 is also disposed on the insulating layer 20.

The pairs of the control transistor CG and the select transistor SG share a drain 35D, which is a part of the semiconductor wire 35, and have sources 35S1 and 35S2, which are also a part of the semiconductor wire 35. In the present disclosure, the terms "a source" and "a drain" may be used to distinguish one from the other, and may be interchangeably used.

The control transistor CG includes a semiconductor wire 35, a stacked dielectric layer 120 wrapping around a part of the semiconductor wire (channel) 35C1 or 35C2, and a control gate (CG) electrode 70C formed on and around the stacked gate dielectric layer 120 wrapping around the part of the semiconductor wire 35C1 or 35C2. In some embodiments, the stacked dielectric layer 120 is disposed between the CG electrode 70C and the SG electrode 70S and is also disposed on the insulating layer 20.

The semiconductor wire 35 is formed as one wire structure and has corresponding anchor portions 30. The semiconductor wire 35 is made of a suitable semiconductor, such as silicon or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. The semiconductor wire 35 is appropriately doped with impurities. The thickness T1, T2 of semiconductor wire 35 in the select transistor SG and the control transistor CG is in a range from about 3 nm to 25 nm, and the width W1, W2 of semiconductor wire 35 is in a range from about 3 nm to 10 nm, in some embodiments. The cross sectional shape of the semiconductor wire 35 may be substantially square with rounded corners, rectangular with rounded corners, triangular with rounded corners, polygonal with rounded corners, oval, circular, or the like.

In some embodiments, the gate dielectric layer 130 is made of $SiO_2$ formed by chemical vapor deposition (CVD) or atomic layer deposition (ALD). In other embodiments, the gate dielectric layer 130 includes one or more high-k dielectric layers having a dielectric constant greater than that of $SiO_2$. For example, the gate dielectric layer 130 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. In some embodiments, the gate dielectric layer 130 has a thickness T3 of about 1 nm to about 8 nm.

The stacked dielectric layer 120 includes a first dielectric layer 121 disposed on and around the semiconductor wire 35, a second dielectric layer 122 disposed on the first dielectric layer 121 and a third dielectric layer 123 disposed on the second dielectric layer. As shown in FIG. 1D, the stacked dielectric layer 120 is also disposed on the insulating layer 20. In some embodiments, the first and third dielectric layers 121 and 123 are made of $SiO_2$ or other suitable metal oxide dielectric materials. The stacked dielectric layer 120 has a thickness T4 of about 5 nm to about 25 nm in some embodiments. In some embodiments, the first dielectric layer has a thickness of about 1 nm to about 5 nm the third dielectric layer has a thickness of about 2 nm to about 8 nm. The second dielectric layer 122, which functions as a charge trapping layer of an NVM cell, is made of one or more of SiN, SiON, $HfO_2$, $ZrO_2$ or other suitable dielectric materials in some embodiments. Si-dots may be used as the charge trapping layer in certain embodiments. In some embodiments, second dielectric layer 122 has a thickness of about 2 nm to about 12 nm.

The gate electrodes 70S and 70C include one or more conductive materials, such as W, Cu, Ti, Ag, Al, TiAl, TiAlN, TaC, TaCN, TaSiN, Mn, Co, Pd, Ni, Re, Jr, Ru, Pt, and/or Zr, or any other suitable material. In some embodiments, the gate electrodes 70S and 70C include a conductive material, such as TiN, WN, TaN, and/or Ru. Metal alloys such as Ti—Al, Ru—Ta, Ru—Zr, Pt—Ti, Co—Ni and Ni—Ta may be used and/or metal nitrides such as $WN_x$, $TiNX$, $MoN_x$, $TaN_x$, and $TaSi_xN_y$ may be used. In certain embodiments of the present disclosure, the gate electrodes 70S and 70C include one or more work function adjustment layers disposed on the gate dielectric layer 130. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials, or any other suitable material. For the n-channel FinFET, one or more of TaN, TaAlC, TiN, TiC, Co, TiAl, HfTi, TiSi and TaSi, or any other suitable material is used as the work function adjustment layer, and for the p-channel FinFET, one or more of TiAlC, Al, TiAl, TaN, TaAlC, TiN, TiC and Co, or any other suitable material is used as the work function adjustment layer.

The width L1 of the select gate electrode 70S is in a range from about 5 nm to about 50 nm and the width L2 of the select gate electrode 70C is in a range from about 5 nm to about 50 nm, in some embodiments. The width L1 may be the same as or different from the width L2. A space S1 between the end of one select gate electrode and the end of the other select gate electrode is in a range from about 30 nm to about 200 nm, and a space S2 between the end of the control gate electrode and the anchor portion is in a range from about 30 nm to about 200 nm, in some embodiments. In some embodiments, one or more sidewall spacers (not shown) are disposed on one side of the select gate electrode 70S and one side of the control gate electrode 70C. The height H1 of the control gate electrode 70C is smaller than the height H2 of the select gate electrode 70S in some embodiments. The height H1 of the control gate electrode 70C is greater than the height H2 of the select gate electrode 70S in other embodiments.

In some embodiments, the substrate 10 may be made of a suitable semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or any other suitable material. The insulating layer 20 may be made of $SiO_2$ or other suitable insulating material.

Figure 1E:
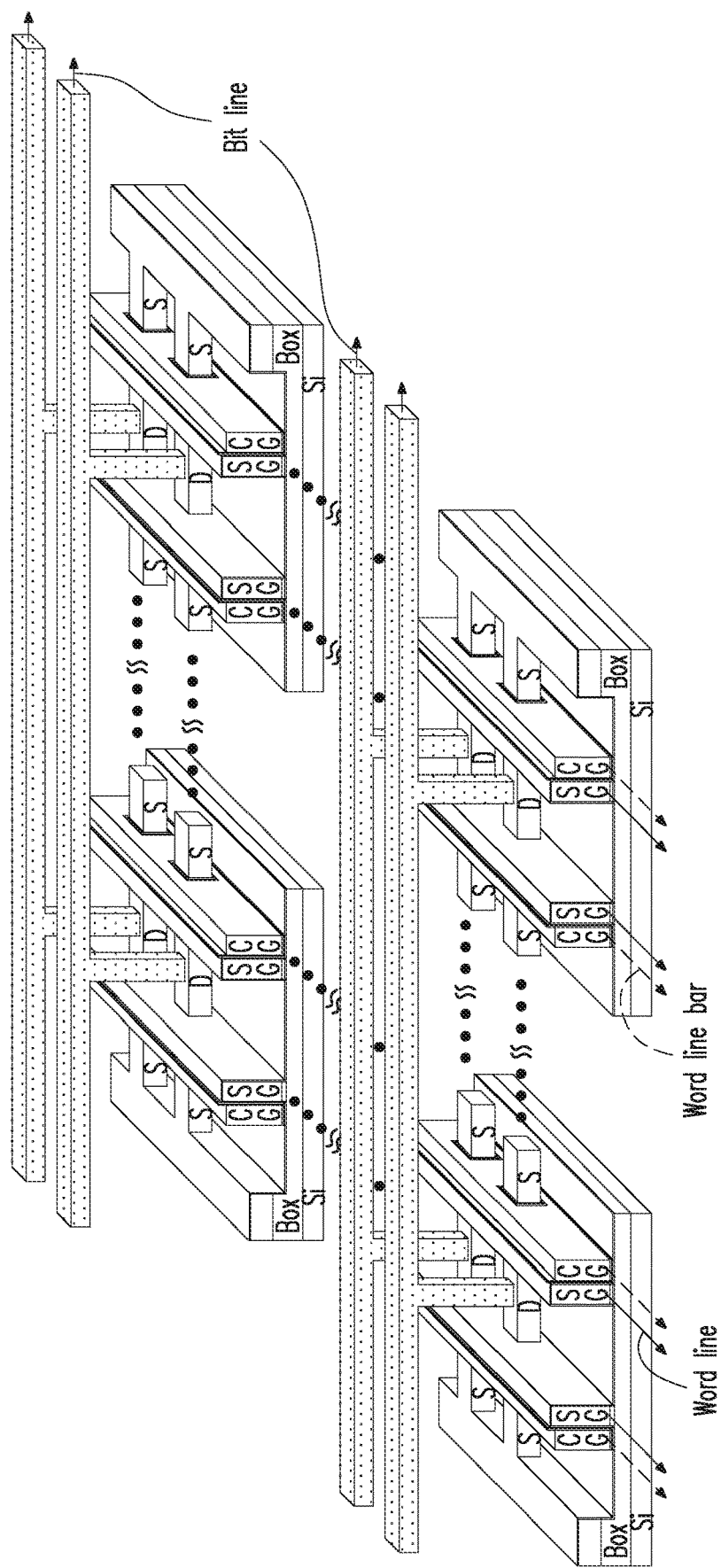
FIG. 1E is a perspective view of a non-volatile memory array in accordance with embodiments of the present disclosure.

FIG. 1E is a perspective view of a non-volatile memory cell array in accordance with embodiments of the present disclosure. In FIG. 1E, two or more semiconductor wires are disposed over the substrate and the select gate electrodes and the control gate electrodes are disposed over the two or more semiconductor wires. The drains are coupled to bit lines and select gate electrodes and control gate electrodes function as word lines. The sources may be coupled to appropriate power supplies.

FIGS. 2-16 illustrate various stages of a semiconductor device fabrication process in accordance with embodiments of the present disclosure. It is understood that additional operations can be provided before, during, and after processes shown by FIGS. 2-16, and some of the operations described below can be replaced or eliminated, for additional embodiments of the method. The order of the operations/processes may be interchangeable.

Figure 2:
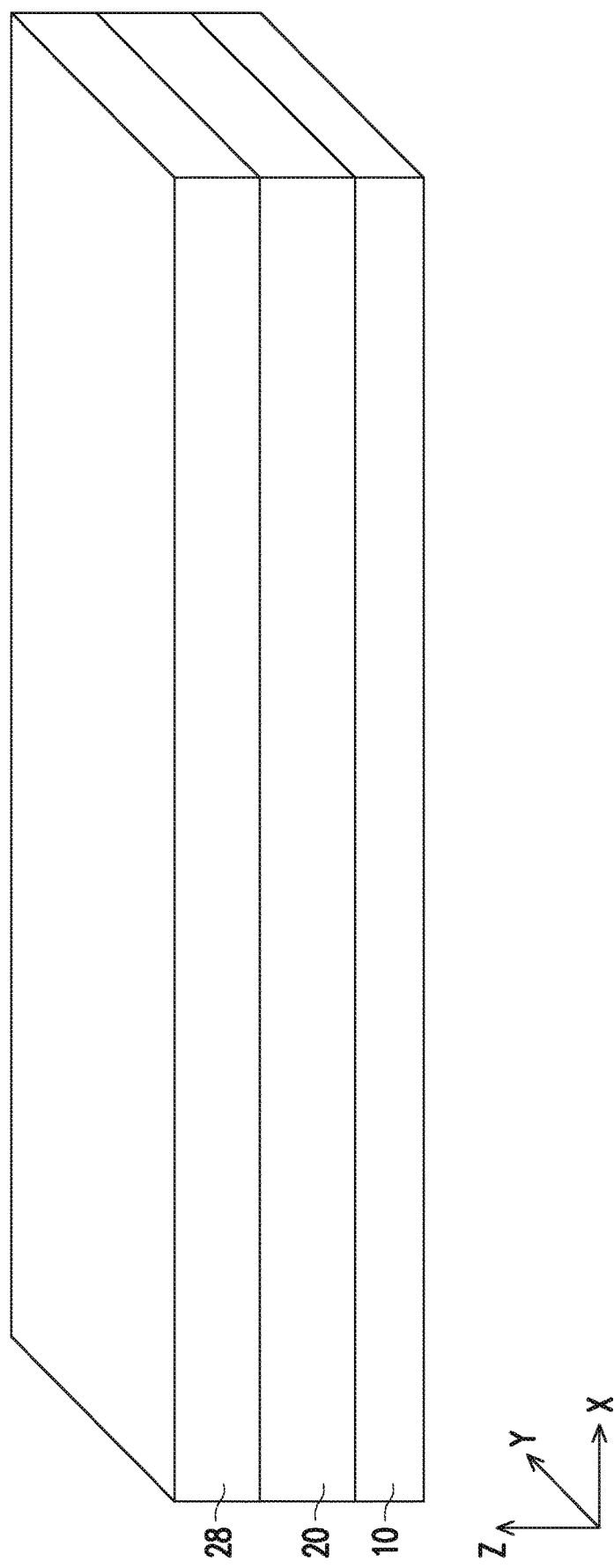
FIG. 2 illustrates one of the various stages in a semiconductor device fabrication process in accordance with embodiments of the present disclosure.

In FIG. 2, a semiconductor-insulator-semiconductor structure including a substrate 10, an insulating layer 20 and an upper semiconductor layer 28 is prepared. In some embodiments, the semiconductor-insulator-semiconductor structure is a silicon-on-insulator (SOI) wafer. The thickness of the insulating layer 20 is in a range from about 100 nm to 3000 nm in some embodiments. The thickness of the upper semiconductor layer 28 is in a range from about 10 nm to 200 nm in some embodiments.

Figure 3:
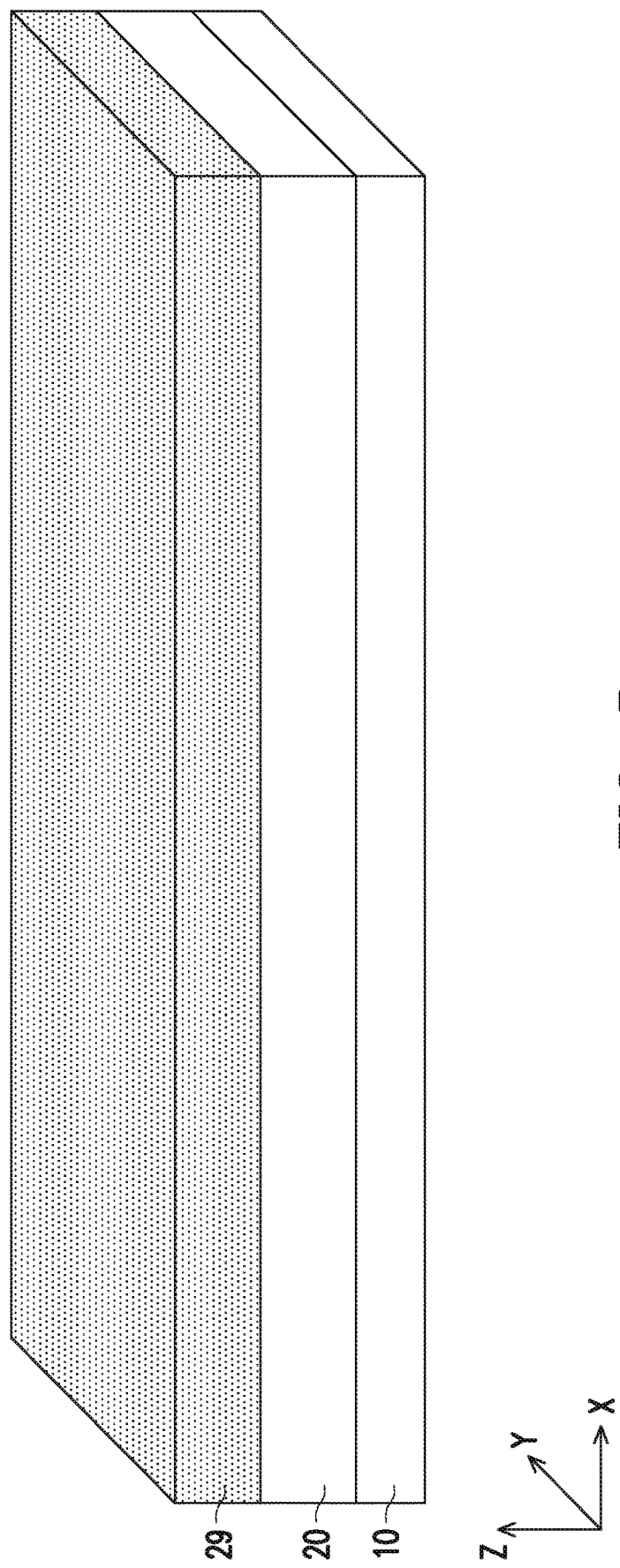
FIG. 3 illustrates one of the various stages in a semiconductor device fabrication process in accordance with embodiments of the present disclosure.

As shown in FIG. 3, impurities are introduced into the upper semiconductor layer 28, thereby forming a doped upper semiconductor layer 29. The impurities, such as P, As, In, B and/or $BF_2$, are introduced by one or more ion implantation operations with appropriate photo lithography operations. The doping concentration for the doped upper semiconductor layer 29 is in a range from about $10 \times 10^{12}$ to about $10 \times 10^{15}$ cm$^{-3}$ in some embodiments. In some embodiments, the implantation operation(s) is not performed at this stage of the manufacturing operation, but rather is performed at a later stage.

Figure 4:
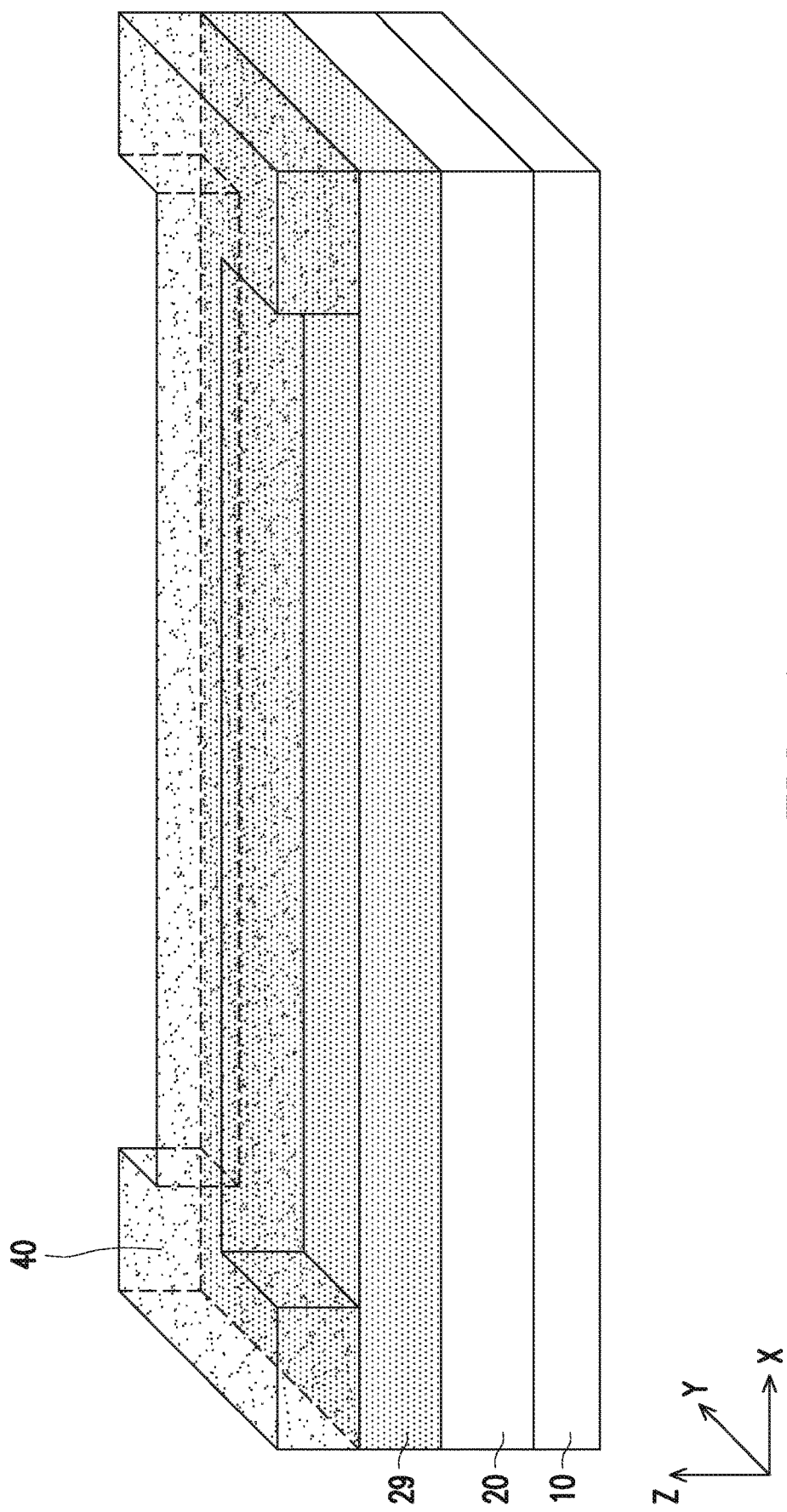
FIG. 4 illustrates one of the various stages in a semiconductor device fabrication process in accordance with embodiments of the present disclosure.

Then, as shown in FIG. 4, a mask pattern 40 is formed over the doped upper semiconductor layer 29. The mask pattern 40 may be a photo resist pattern or a hard mask pattern formed by one or more layers of $SiO_2$ and SiN, or any other suitable material. The mask pattern 40 may have an "I" shape having a main portion and anchor portions disposed at both ends of the main portion.

Figure 5:
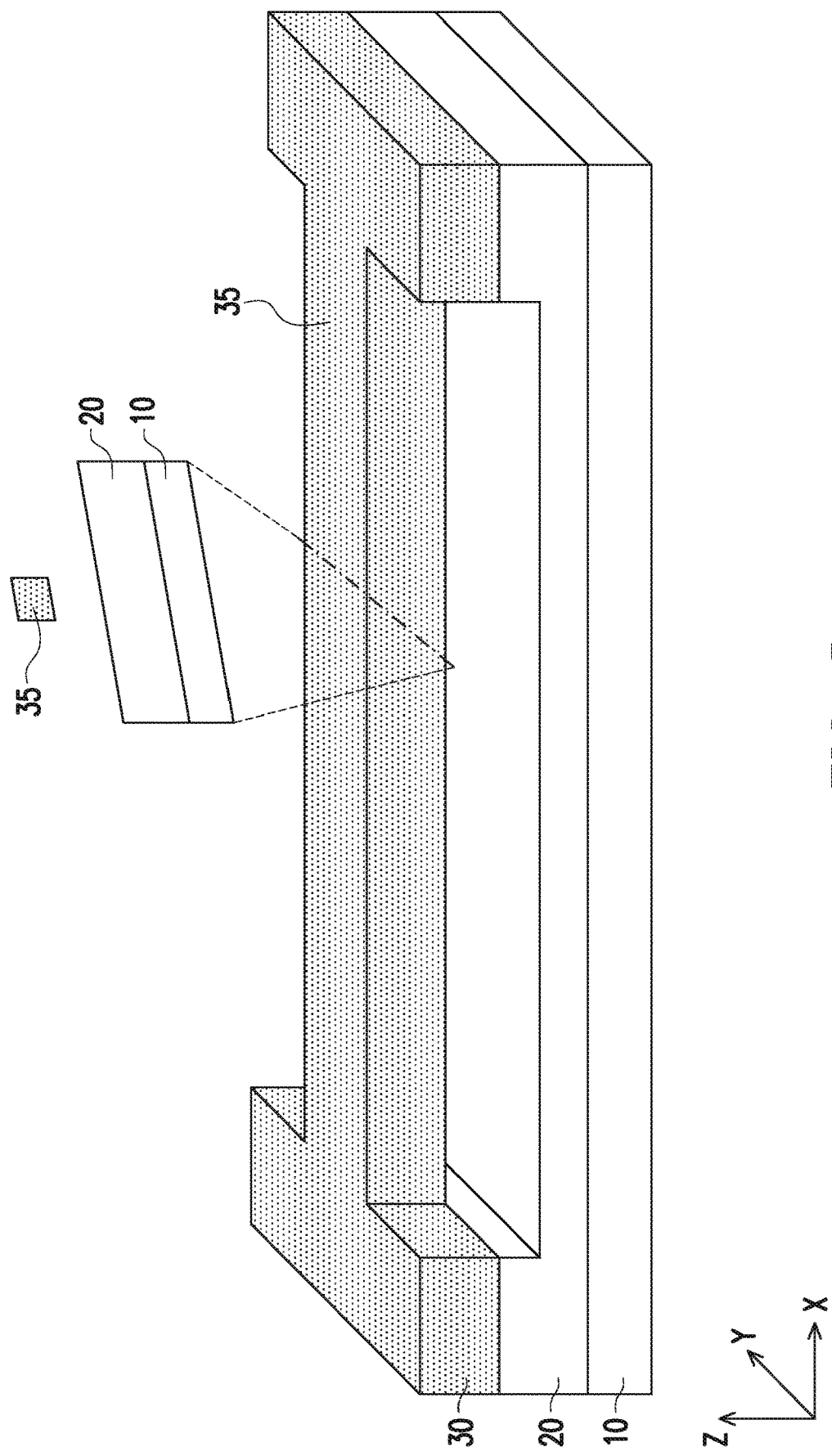
FIG. 5 illustrates one of the various stages in a semiconductor device fabrication process with a cross sectional view in accordance with embodiments of the present disclosure.

Next, as shown in FIG. 5, which also shows a cross sectional view, the doped upper semiconductor layer 29 is patterned by using the mask pattern 40 as an etching mask, and the insulating layer 20 is recessed by dry and/or wet etching. By this recess etching, the insulating layer 20 under the main portion of the "I" shape of the upper semiconductor layer 29 is removed, thereby forming a semiconductor wire 35, and anchor portions 30, as shown in FIG. 5. In some embodiments, the implantation operation(s) for the doped upper semiconductor is performed after the wire structure 35 is formed. Subsequently, the mask pattern 40 is removed.

Figure 6:
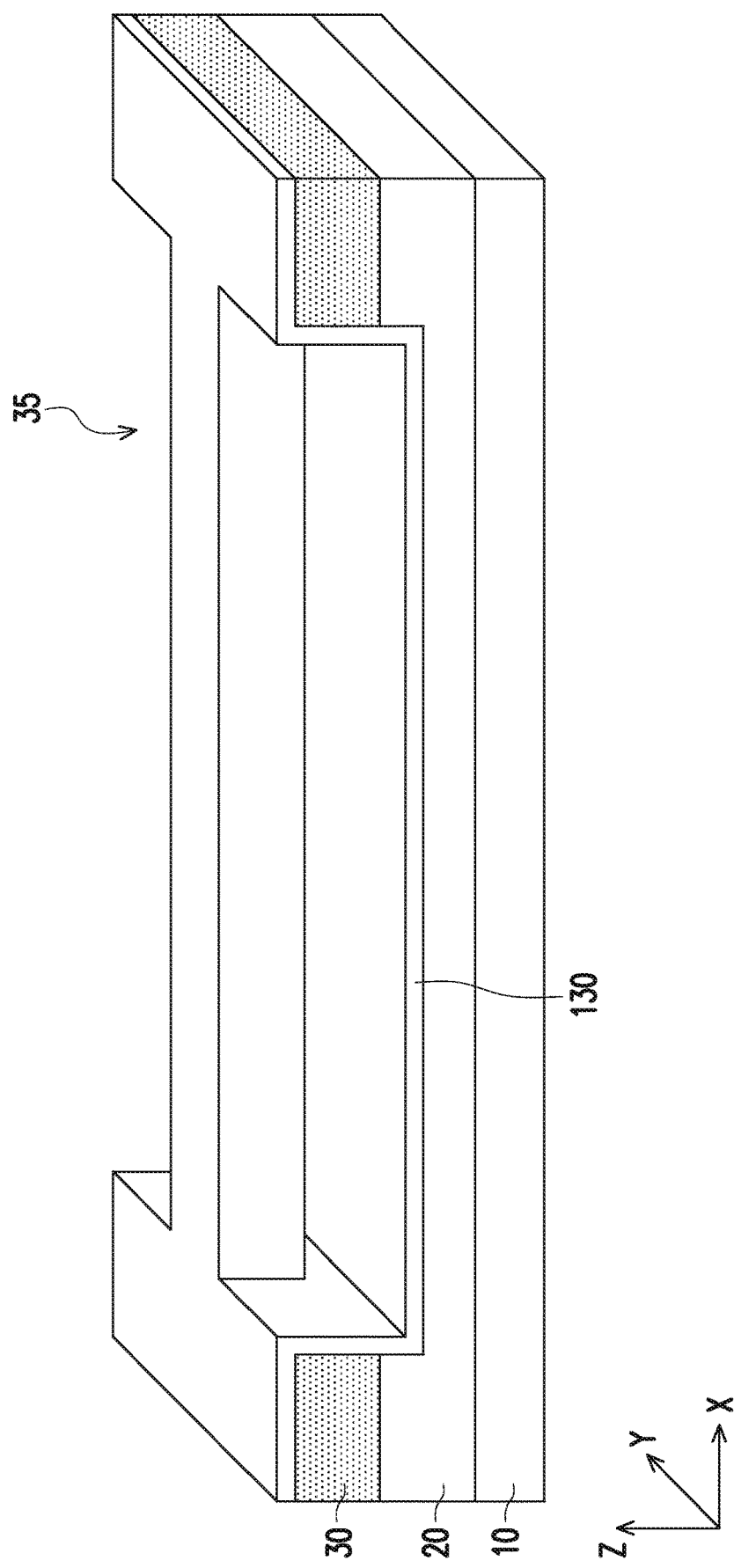
FIG. 6 illustrates one of the various stages in a semiconductor device fabrication process in accordance with embodiments of the present disclosure.

After the semiconductor wire is formed, a gate dielectric layer 130 is formed around the semiconductor wire 35 and on other portions including the upper surface of the recessed insulating layer 20, as shown in FIG. 6. The gate dielectric layer 130 can be formed by thermal oxidation, chemical vapor deposition (CVD), physical vapor deposition (PVD) or atomic layer deposition (ALD).

Figure 7:
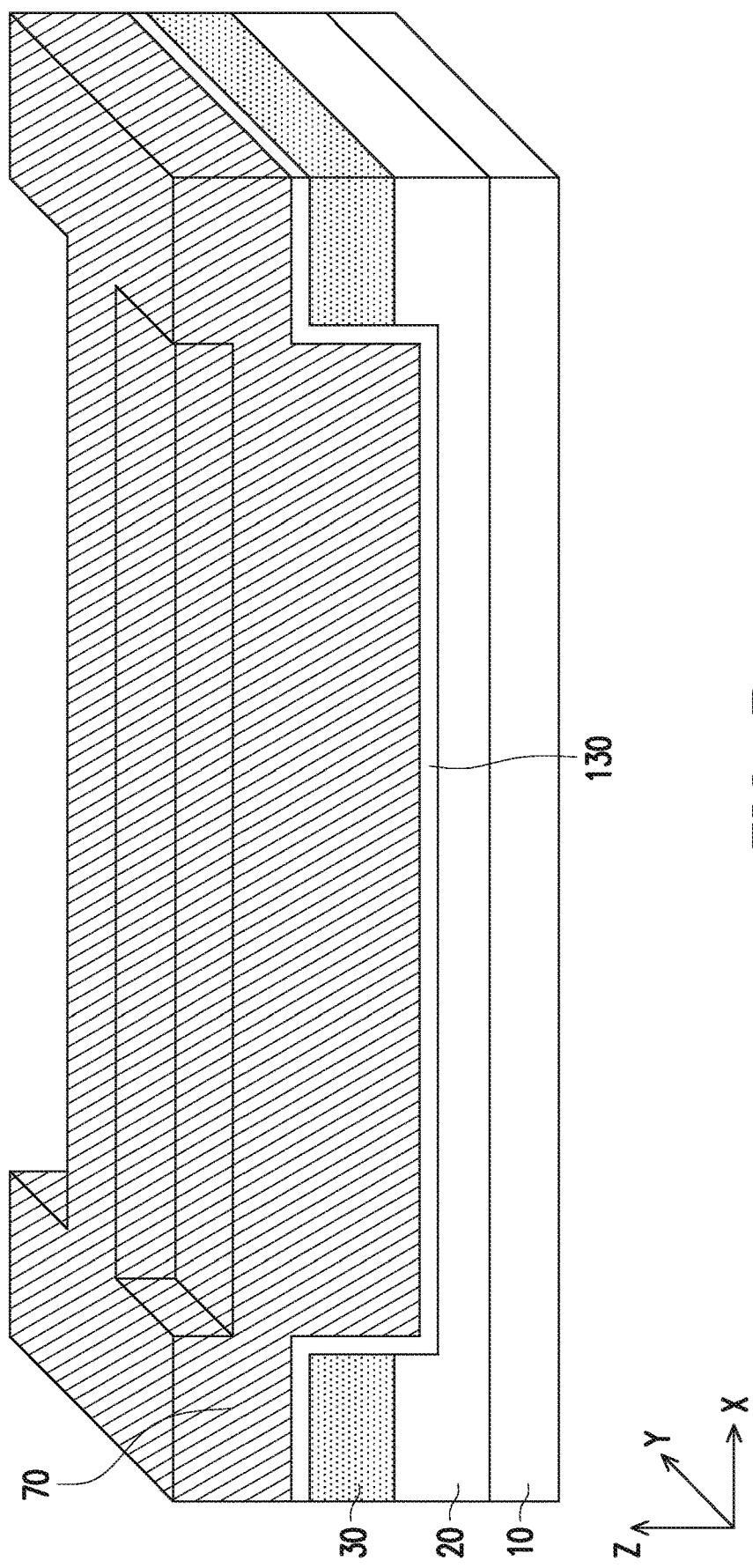
FIG. 7 illustrates one of the various stages in a semiconductor device fabrication process in accordance with embodiments of the present disclosure.

Subsequently, as shown in FIG. 7, a first gate layer 70 is formed over the gate dielectric layer 130 by CVD, PVD or ALD or any other suitable methods. The first gate layer 70 may be doped polysilicon or doped amorphous silicon. The first gate layer 70 is formed on the gate dielectric layer 130 wrapping around the semiconductor wire 35 and on the gate dielectric layer 130 formed at the other portions. The semiconductor wire 35 with the gate dielectric layer 130 is fully embedded in the first gate layer 70.

Figure 8:
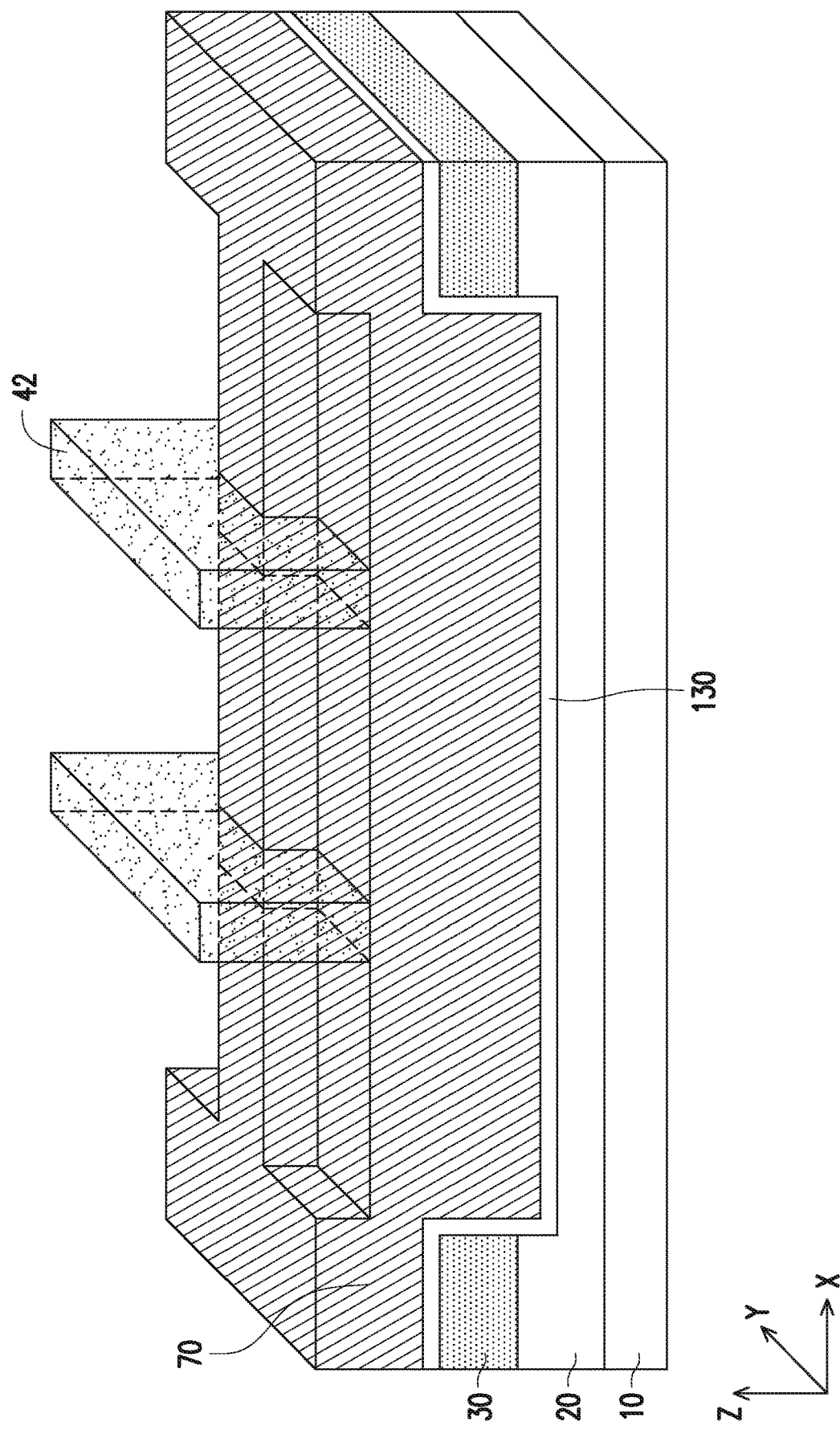
FIG. 8 illustrates one of the various stages in a semiconductor device fabrication process in accordance with embodiments of the present disclosure.
Figure 9:
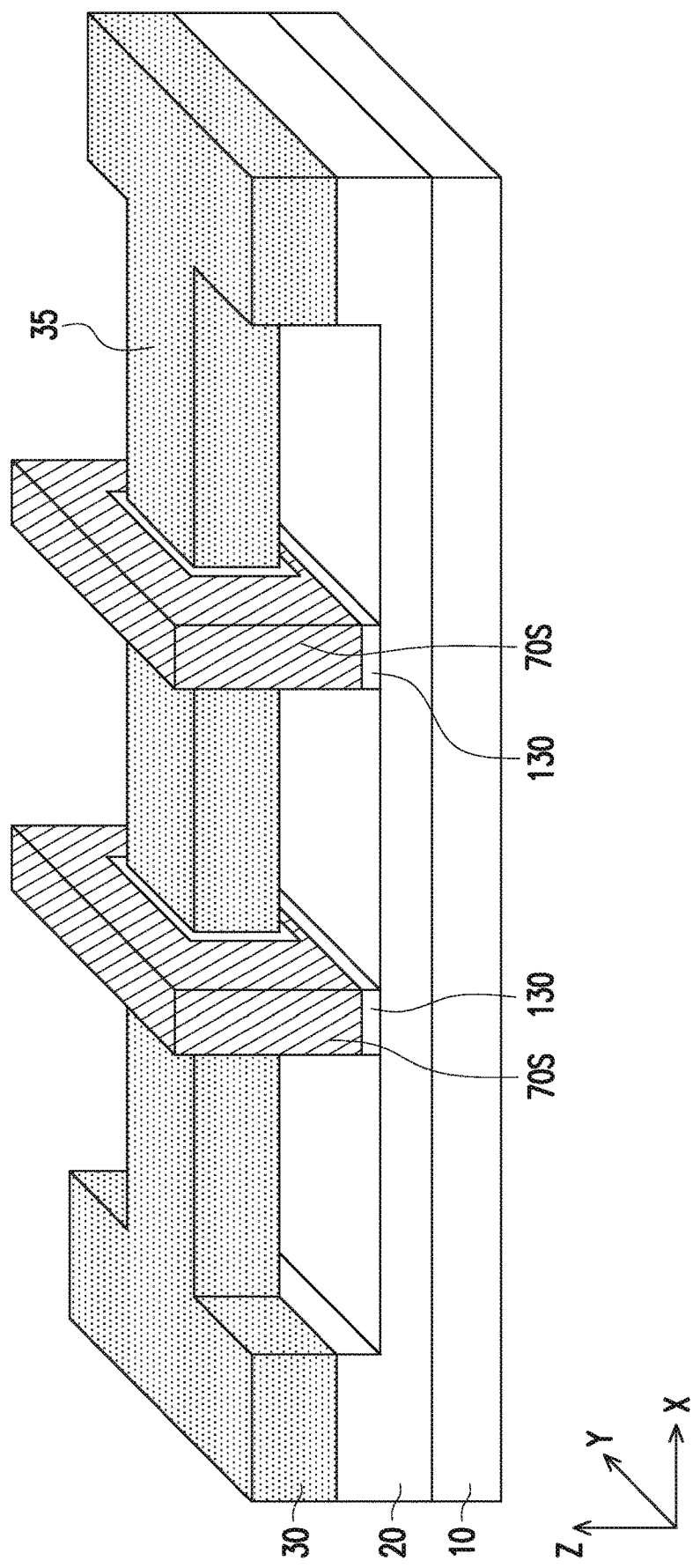
FIG. 9 illustrates one of the various stages in a semiconductor device fabrication process in accordance with embodiments of the present disclosure.

Then, as shown in FIG. 8, a mask pattern 42 is formed over the first gate layer 70. By using a dry etching operation, the first gate layer 70 is patterned into select gate electrodes 70S. As shown in FIG. 9, the gate dielectric layer 130 is further etched, except for the region under the select gate electrodes, by using suitable etching gas. After the select gate electrodes 70S are formed by etching, the semiconductor wire 35 is exposed except for the portions covered by the select gate electrodes 70S.

In certain embodiments, the mask pattern 42 is a photo resist pattern, and by using the photo resist pattern, the first gate layer 70 is etched. In other embodiments, a hard mask layer made of one or more layers of SiO$_2$ and SiN is formed on the first gate layer 70, and the hard mask layer is patterned by etching using the resist mask pattern 42. Further, the first gate layer 70 is patterned by using the patterned hard layer.

Figure 10:
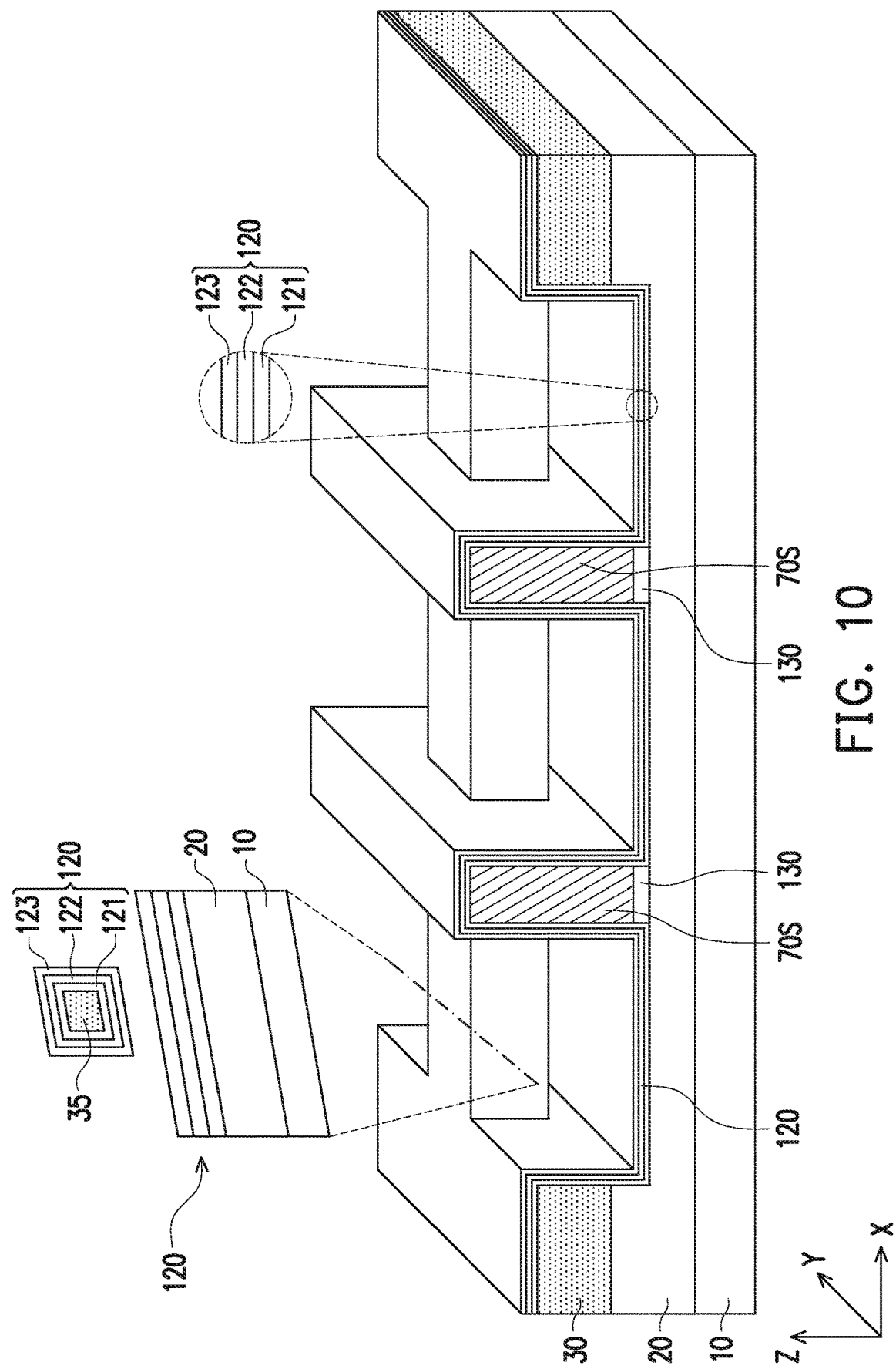
FIG. 10 illustrates one of the various stages in a semiconductor device fabrication process with an enlarged view in accordance with embodiments of the present disclosure.

After the select gate electrode 70S are formed, a stacked dielectric layer 120 is formed. The stacked layer 120 includes a first portion formed on and around the exposed semiconductor wire 35 and a second portion formed on the other remaining portions including the select gate electrodes 70S and over the substrate, as shown in FIG. 10. The stacked dielectric layer 120 including the first to third dielectric layers 121, 122, 123 can be formed by thermal oxidation, chemical vapor deposition (CVD), physical vapor deposition (PVD) or atomic layer deposition (ALD).

Figure 11:
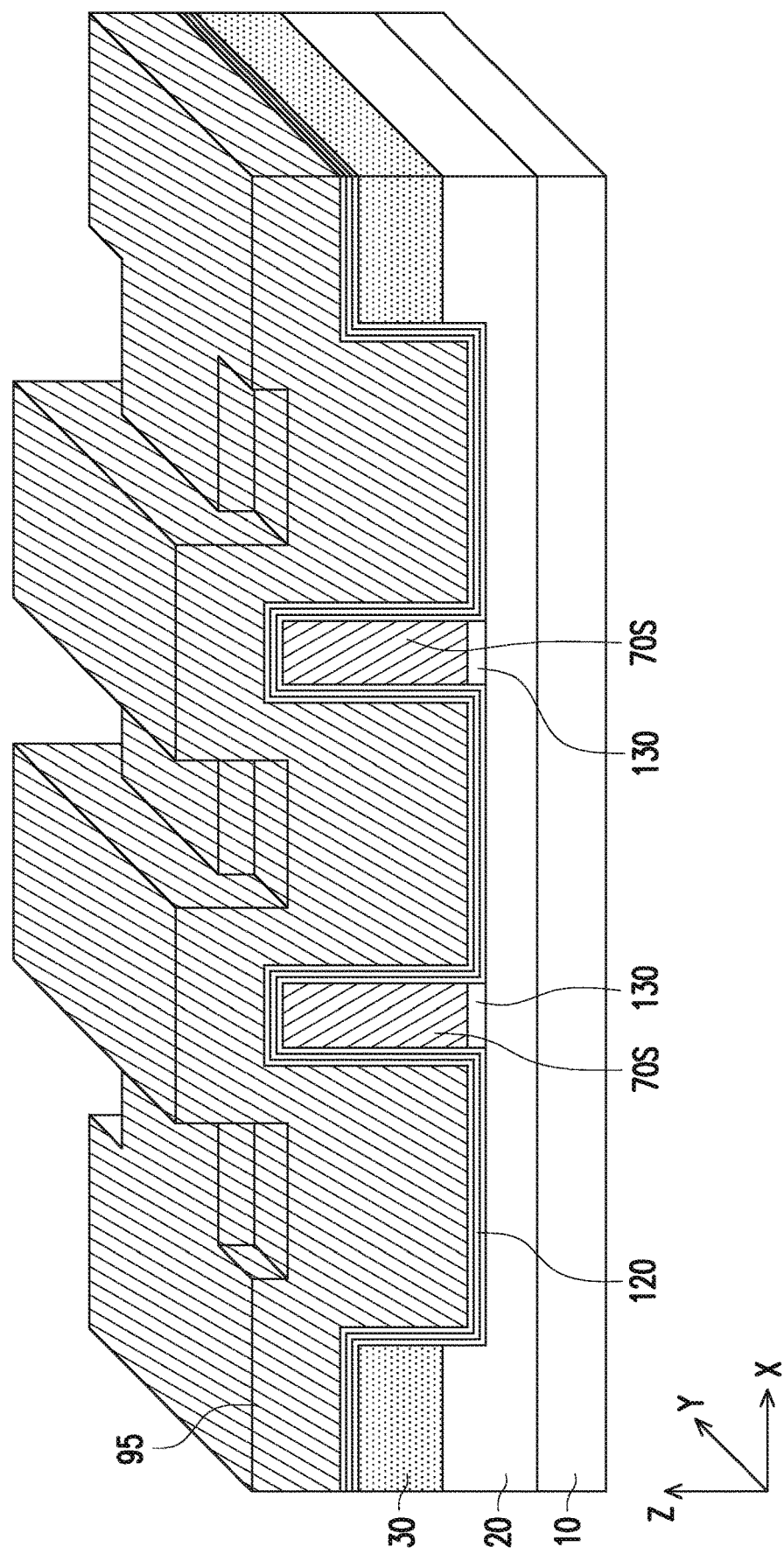
FIG. 11 illustrates one of the various stages in a semiconductor device fabrication process in accordance with embodiments of the present disclosure.
Figure 12:
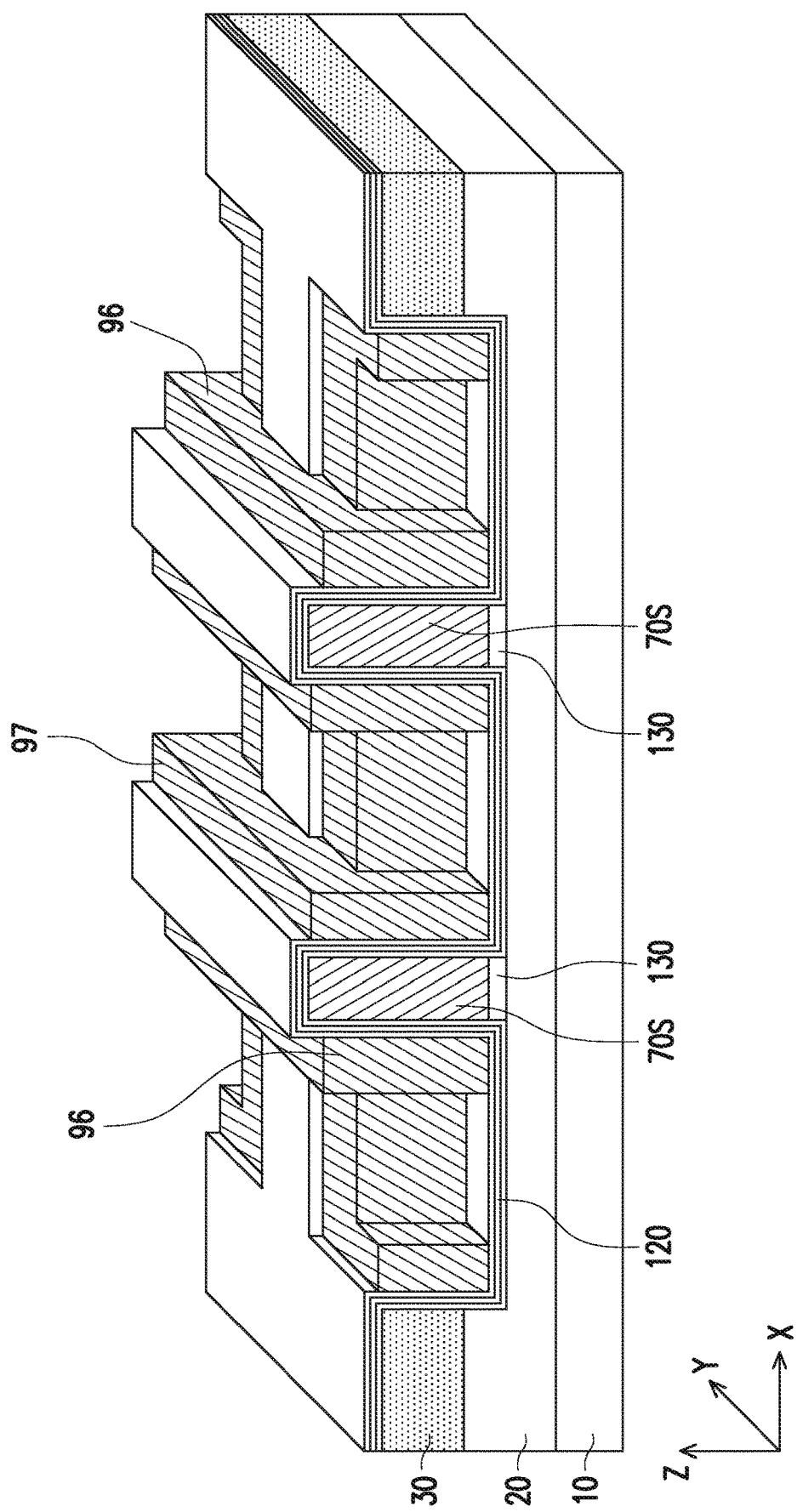
FIG. 12 illustrates one of the various stages in a semiconductor device fabrication process in accordance with embodiments of the present disclosure.

Then, as shown in FIG. 11, a second gate layer 95 is formed over the stacked dielectric layer 120. The second gate layer 70 may be doped polysilicon or doped amorphous silicon. Then, as shown in FIG. 12, an etch-back operation using dry etching is performed to expose the upper portions of the stacked dielectric layer 120 formed on the select gate electrodes 70S and formed on the semiconductor wire 35. By the etch-back operation, sidewall structures 96, 97 are formed on opposing side faces of the select gate electrode 70 covered with stacked dielectric layer 120.

Figure 13:
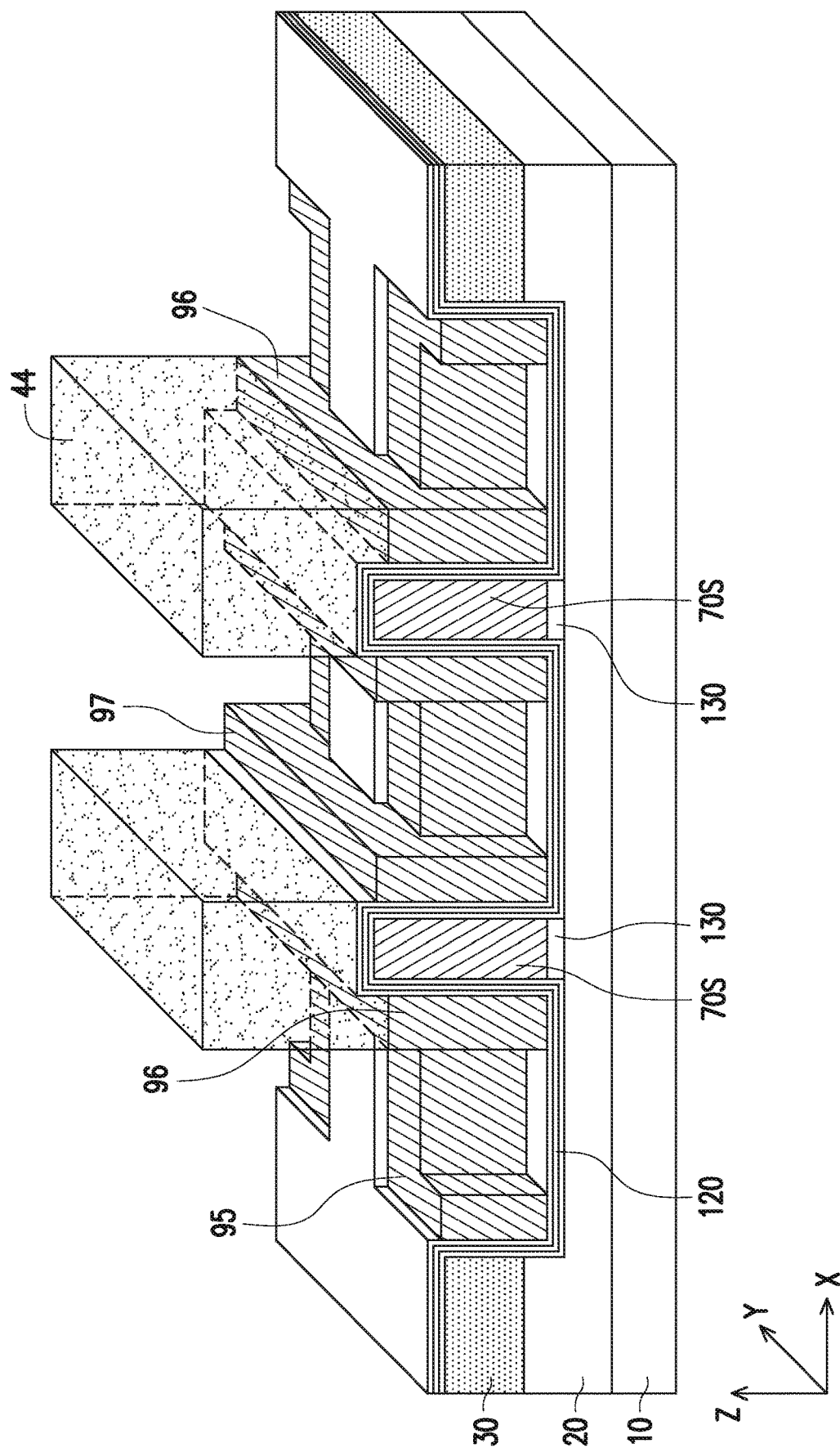
FIG. 13 illustrates one of the various stages in a semiconductor device fabrication process in accordance with embodiments of the present disclosure.
Figure 14:
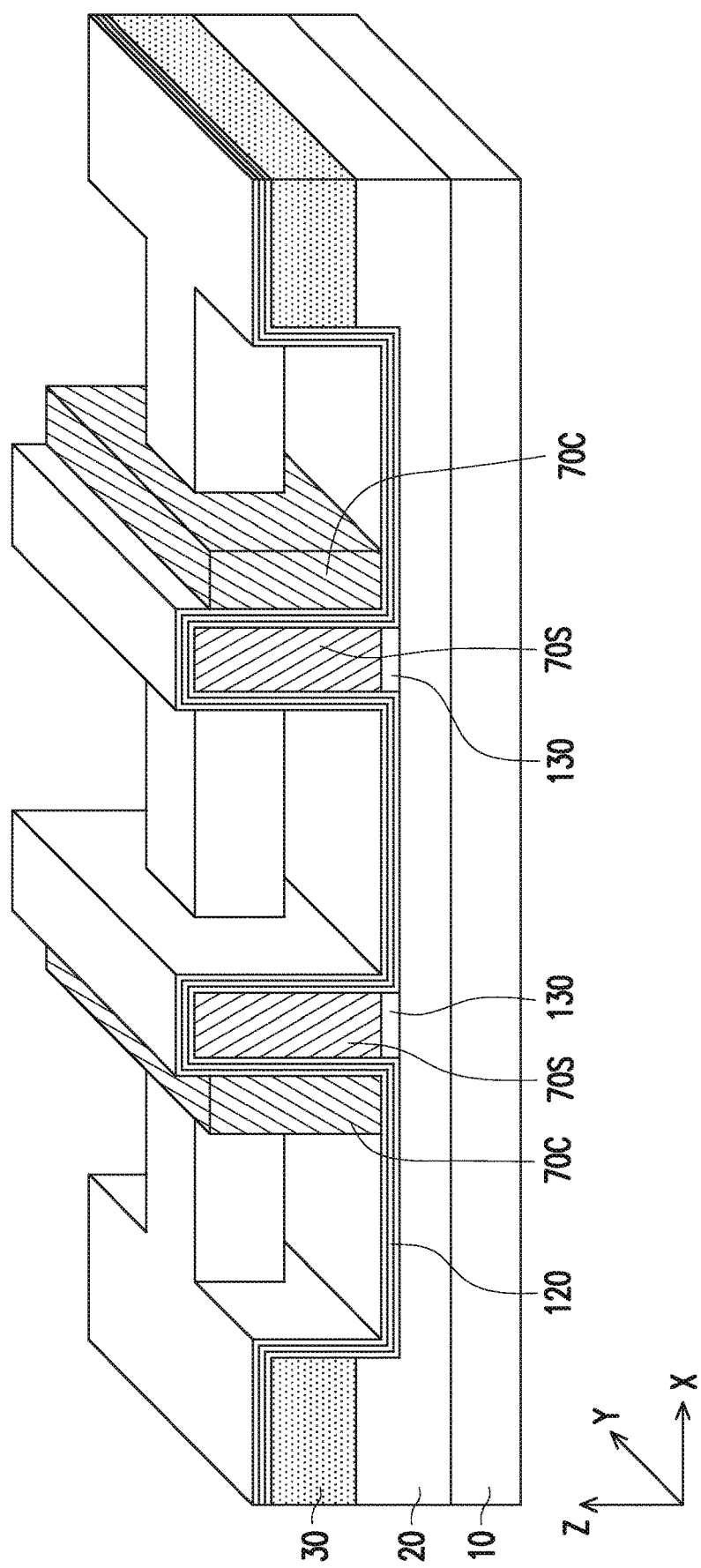
FIG. 14 illustrates one of the various stages in a semiconductor device fabrication process in accordance with embodiments of the present disclosure.

Further, as shown FIG. 13, a mask pattern 44 is formed over the structure of FIG. 12. The mask pattern 44 is a resist pattern in some embodiments. The mask pattern 44 covers the sidewall structures 96. Then, by using dry and/or wet etching, the second gate layers 95 not covered by the mask pattern 44 are removed, thereby forming control gate electrodes 70C.

Figure 15:
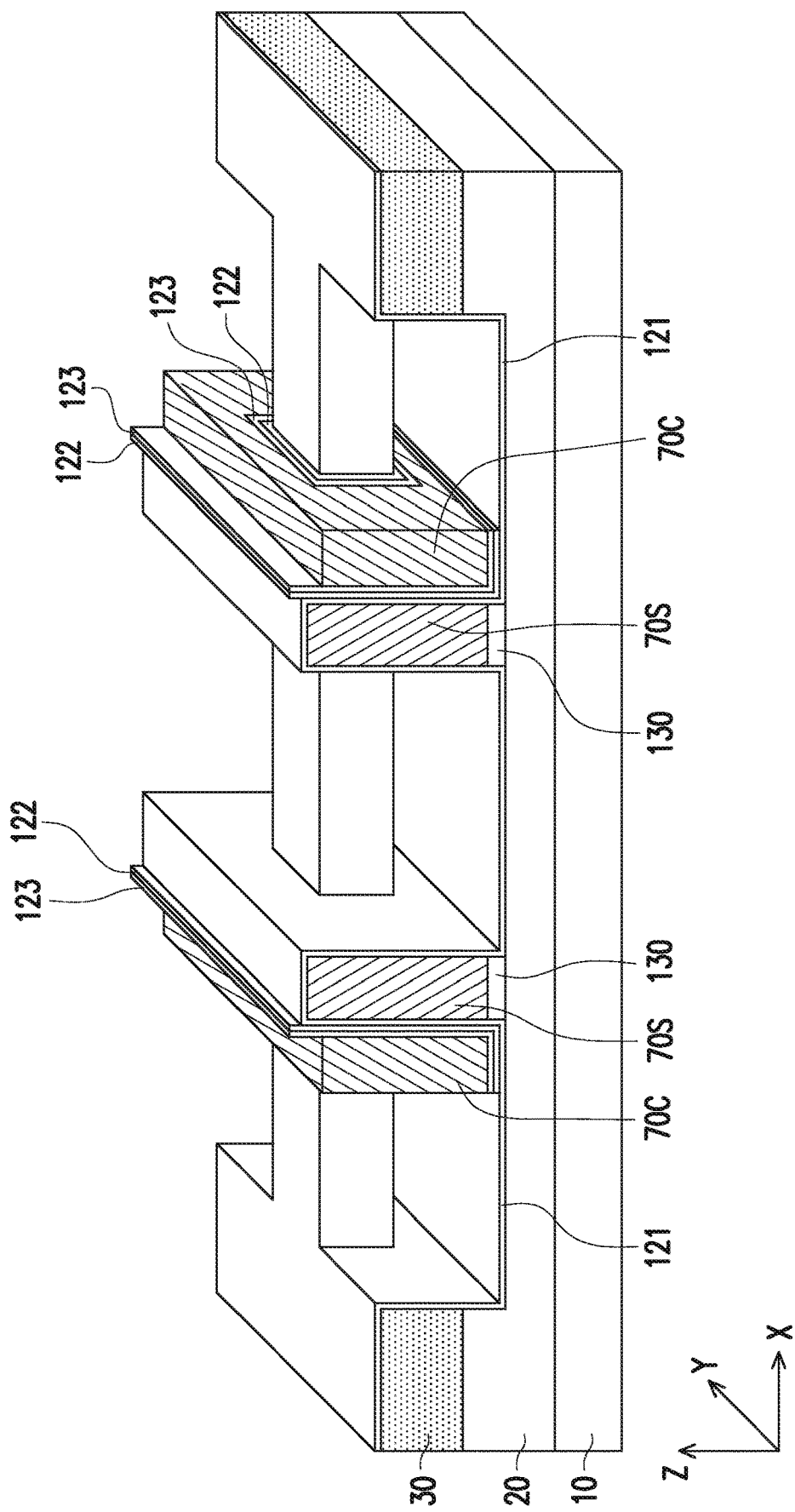
FIG. 15 illustrates one of the various stages in a semiconductor device fabrication process in accordance with embodiments of the present disclosure.

Next, as shown in FIG. 15, the third dielectric layer 123 and the second dielectric layer 122 are removed by dry and/or wet etching. Accordingly, the first dielectric layer 121 remains on the anchor portions 30, the insulating layer 20 and the upper surface of the select gate electrode, as shown in FIG. 15. In some embodiments, the third dielectric layer 123 and the second dielectric layer 122 are not removed, or only the third dielectric layer 123 is removed.

Figure 16:
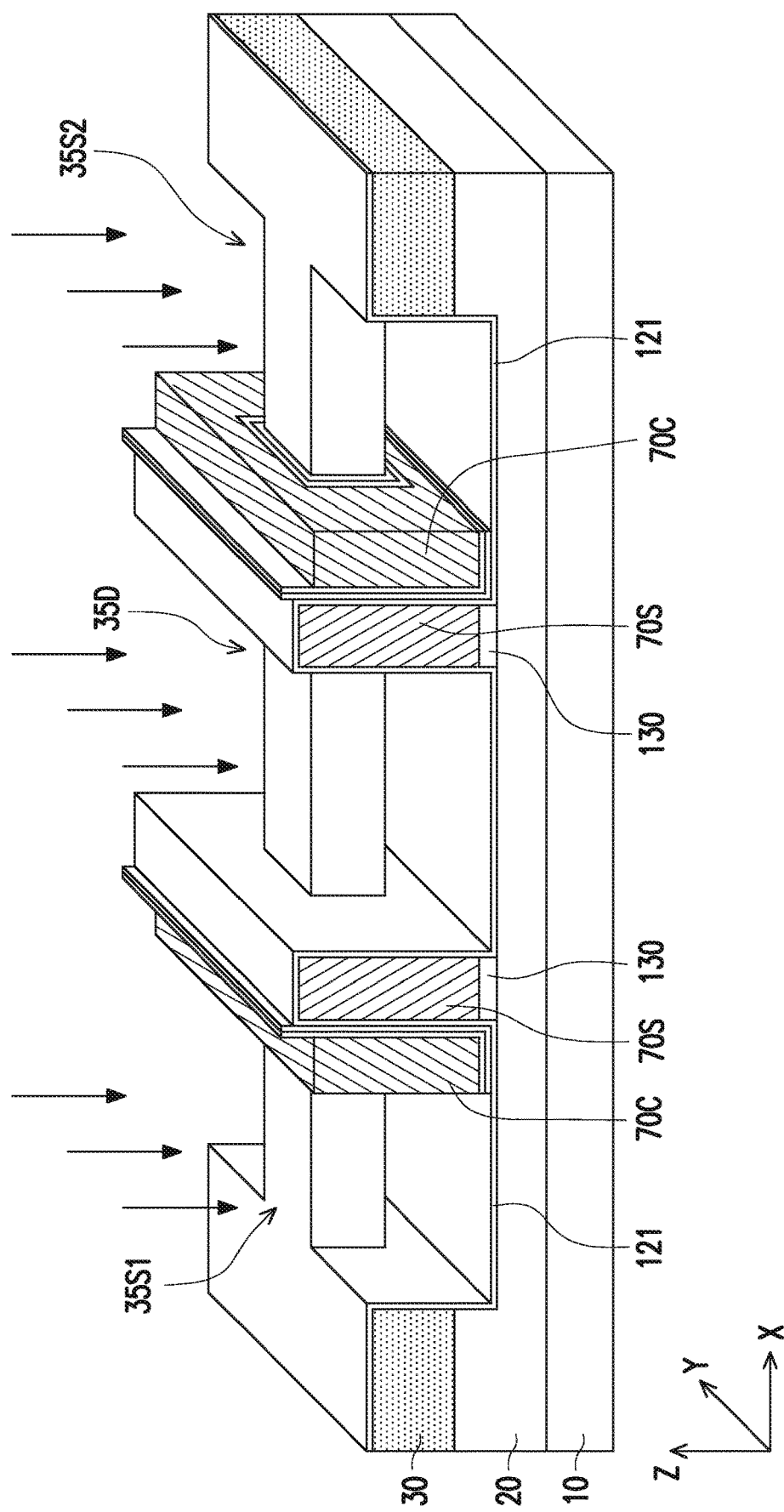
FIG. 16 illustrates one of the various stages in a semiconductor device fabrication process in accordance with embodiments of the present disclosure.

Subsequently, as shown in FIG. 16, one or more ion implantation operations with or without a resist mask are performed to introduce dopant to the source regions 35S1, 35S2 and the drain region 35D of the semiconductor wire covered by the stacked dielectric layer 120. The impurities are, for example, Ge, C, P, As, In, B and/or BF$_2$ in some embodiments. The doping concentration is in a range from about $10 \times 10^{12}$ to about $10 \times 10^{15}$ cm$^{-3}$ in some embodiments.

As shown in FIG. 16, the control gate electrode and the select gate electrode are adjacent to each other with only the stacked dielectric layer 120 (the second portion of the stacked dielectric layer) interposed therebetween (no other layer exits). Further, a part of the gate dielectric layer 130 is disposed between the select gate electrode 70S and the insulating layer 20, and a part of the stacked dielectric layer 120 (a third portion of the stacked dielectric layer) is disposed between the control gate electrode 70C and the insulating layer 20. No gate dielectric layer is interposed between the control gate 70C and the stacked dielectric layer 120 in some embodiments.

In some embodiments, before and/or after the ion implantation, one or more sets of sidewall spacers are formed on one side face of the control gate electrode 70C not facing the select gate electrode 70S and on one side face of the select gate covered with the first dielectric layer 121 not facing the control gate electrode 70C. The sidewall spacers may include one or more layers of SiO$_2$, SiN, SiON, SiOCN or other suitable dielectric materials and may be formed by depositing a film and anisotropic etching. The thickness of the sidewall spacers is in a range from about 5 nm to about 50 nm in some embodiments. Further, in some embodiments, a bottom-contact-etch-stop layer (BESL) formed over the structure of FIG. 16, and further, one or more interlayer dielectric (ILD) layers is formed on the BESL. The thickness of the BESL is in a range from about 5 nm to about 30 nm in some embodiments.

After the structure of FIG. 16 is formed, further CMOS processes are performed to form various features such as additional interlayer dielectric layers, contacts/vias, interconnect metal layers, and passivation layers, etc.

FIGS. 17-21 illustrate various stages of a semiconductor device fabrication process in accordance with other embodiments of the present disclosure. It is understood that additional operations can be provided before, during, and after processes shown by FIGS. 17-21, and some of the operations described below can be replaced or eliminated, for additional embodiments of the method. The order of the operations/processes may be interchangeable. Materials, configurations, processes and/or operations the same as or similar to those explained with respect to FIGS. 1A-16 may be applied to the following embodiments, and the detailed explanation thereof may be omitted to avoid redundancy.

Figure 17:
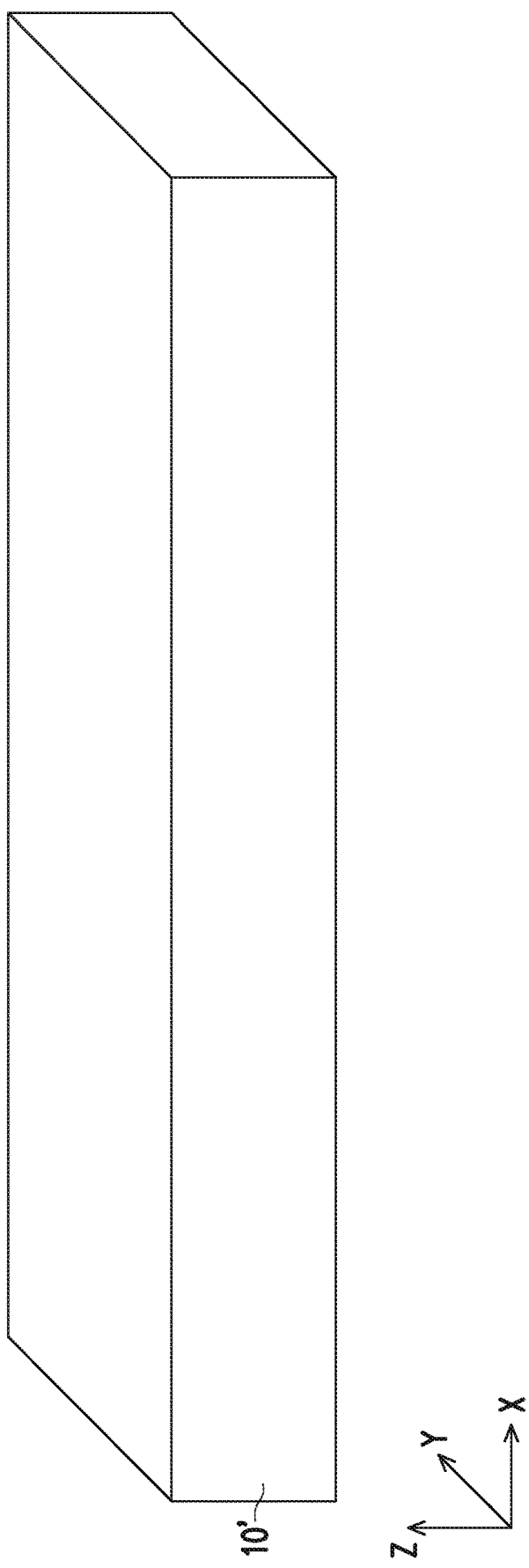
FIG. 17 illustrates one of the various stages in a semiconductor device fabrication process in accordance with other embodiments of the present disclosure.
Figure 18:
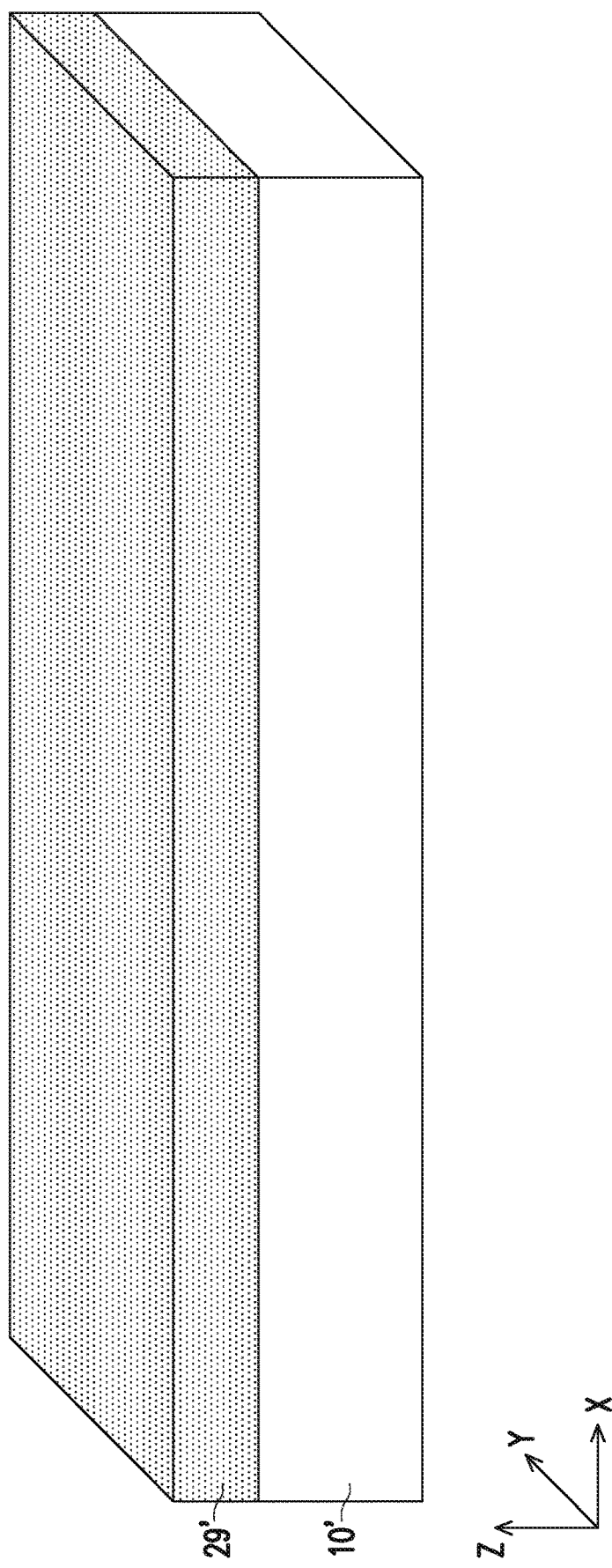
FIG. 18 illustrates one of the various stages in a semiconductor device fabrication process in accordance with other embodiments of the present disclosure.
Figure 19:
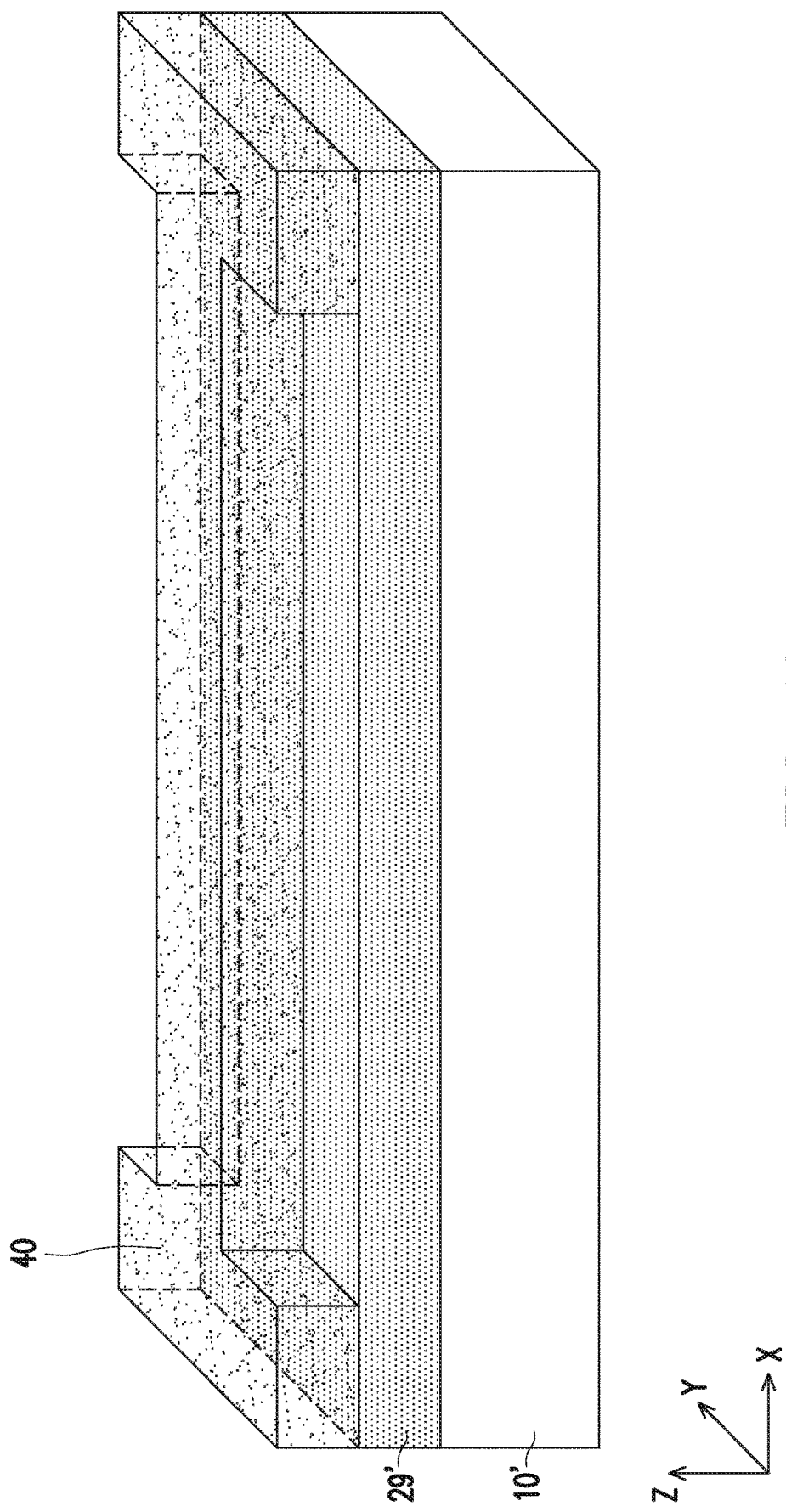
FIG. 19 illustrates one of the various stages in a semiconductor device fabrication process in accordance with other embodiments of the present disclosure.

As show in FIG. 17, a substrate (e.g., a Si wafer) 10' is prepared. The substrate 10' may be made of Ge, Group-IV compound semiconductors or Group III-V compound semiconductors, or any other suitable material in other embodiments. Then, similar to the operations of FIG. 3, impurities are introduced into the upper portion of the substrate 10', thereby forming a doped layer 29', as shown in FIG. 18. Similar to FIG. 4, a mask pattern 40 is formed over the doped layer 29', as shown in FIG. 19.

Figure 20:
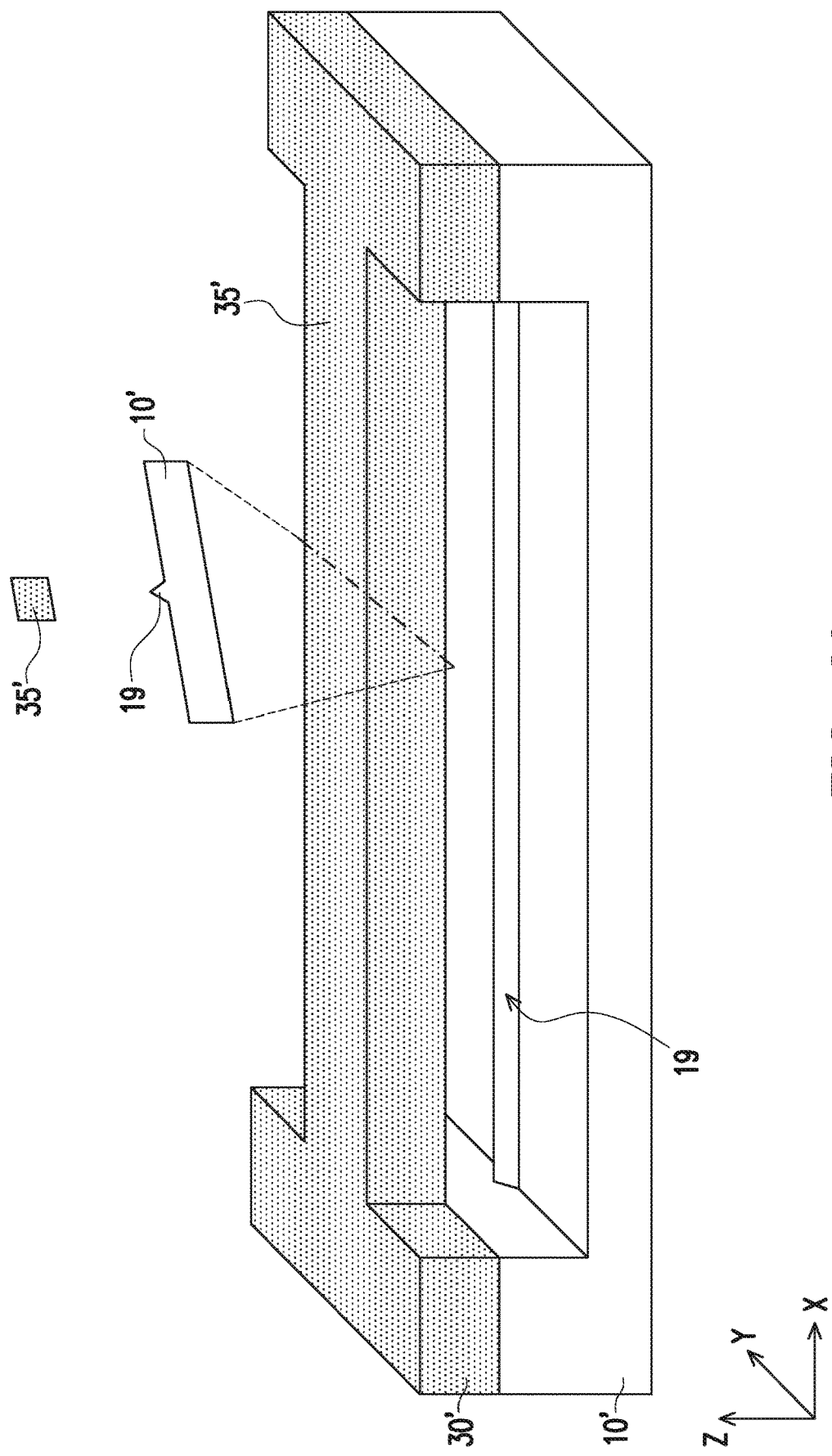
FIG. 20 illustrates one of the various stages in a semiconductor device fabrication process with a cross sectional view in accordance with other embodiments of the present disclosure.

Then, the doped layer 29' and the substrate 10' are etched to form the semiconductor wire 35' and anchor portions 30', as shown in FIG. 20, which also shows a cross sectional view. To form the semiconductor wire, a combination of anisotropic and isotropic etching is used. In the anisotropic etching, a combination of an isotropic etching operation of silicon using SF$_6$ and a sidewall passivation step using C$_4$F$_8$ is utilized. These two steps are repeated to form a vertical recess, followed by the isotropic etching using SF$_6$. Since the etching using SF$_6$ proceeds along the lateral direction as well as the vertical direction, a portion of the substrate 10' under the mask pattern (under the semiconductor wire to be formed) is removed, thereby releasing the semiconductor wire from the substrate 10'. In some embodiments, a protrusion 19 may be formed under the semiconductor wire 35', as shown in FIG. 20.

Figure 21:
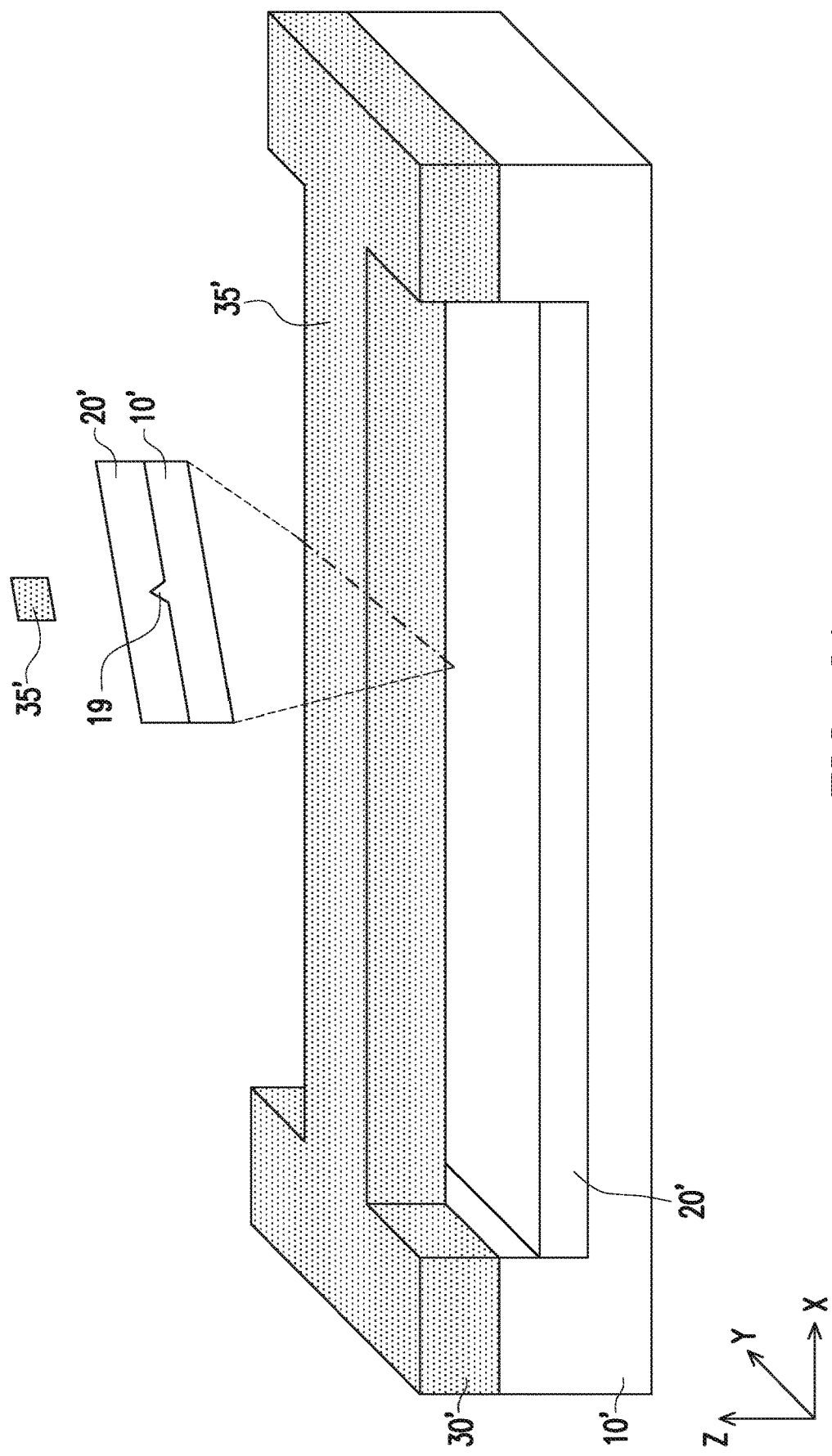
FIG. 21 illustrates one of the various stages in a semiconductor device fabrication process with a cross sectional view in accordance with other embodiments of the present disclosure.

Subsequently, an insulating layer 20' is formed in the recessed substrate 10', as shown in FIG. 21. The insulating layer 20' may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the insulating layer 20' is formed through a process such as CVD, flowable CVD (FCVD), or a spin-on-glass process, although any acceptable process may be utilized. Subsequently, unnecessary portions of the insulating layer 20' are removed using, for example, an etch process, chemical mechanical polishing (CMP), or the like. After the layer 20' is formed, the operations for forming the NVM cell structure as explained with FIGS. 6-16 are performed.

Figure 22A:
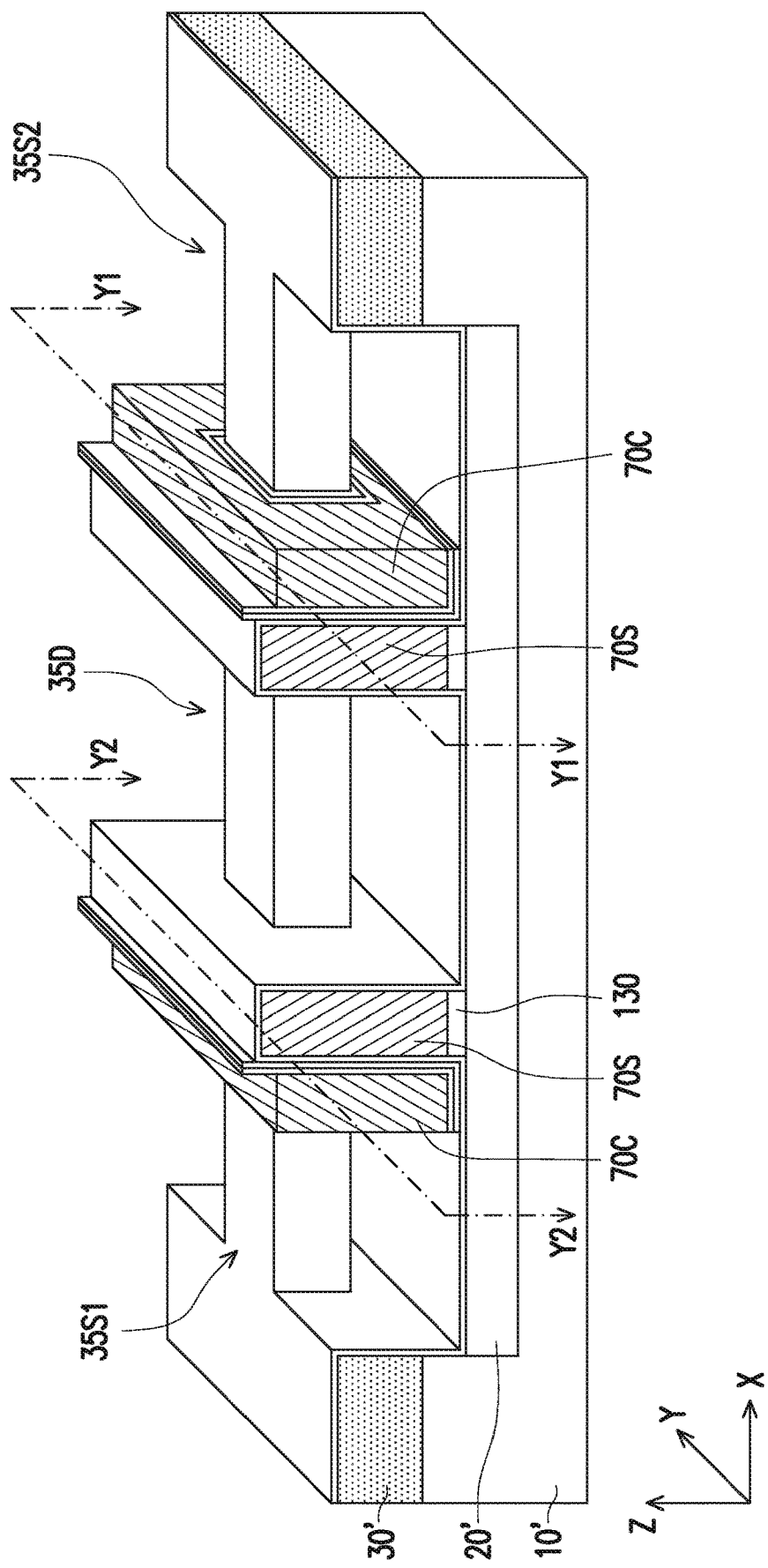
FIG. 22A illustrates one of the various stages in a semiconductor device fabrication process in accordance with other embodiments of the present disclosure.
Figure 22B:
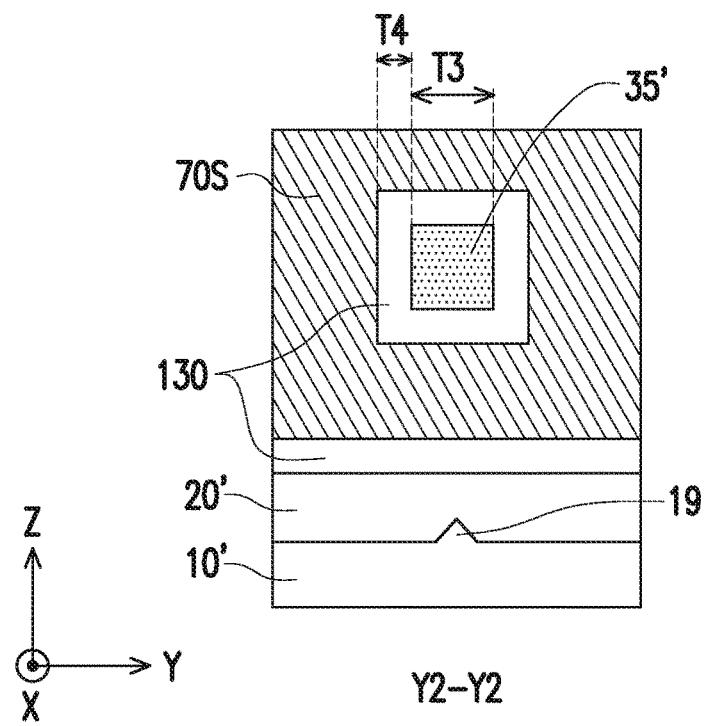
FIG. 22B is a cross sectional view corresponding to line Y2-Y2 of FIG. 22A
Figure 22C:
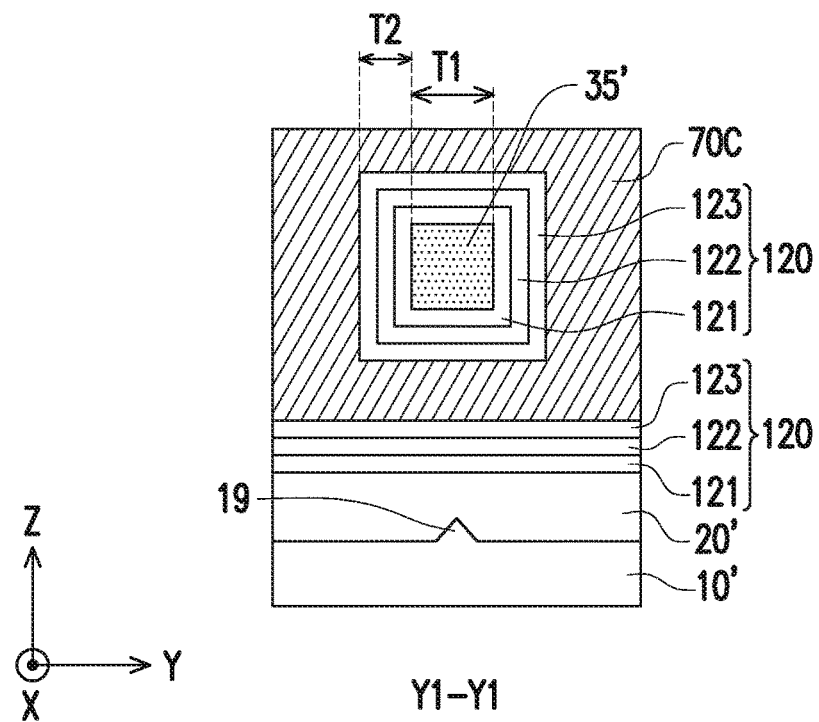
FIG. 22C is a cross sectional view corresponding to line Y1-Y1 of FIG. 22A.

FIG. 22A illustrates one of the various stages in a semiconductor device fabrication process in accordance with other embodiments of the present disclosure. FIG. 22B is a cross sectional view corresponding to line Y2-Y2 of FIG. 22A and FIG. 22C is a cross sectional view corresponding to line Y1-Y1 of FIG. 22A. The structure of FIGS. 22A-22C is substantially the same as the structure of FIGS. 1A-1D except that the protrusion 19 is formed under the semiconductor wire 35' and embedded in the insulating layer 20', as shown in FIG. 20.

FIGS. 23-26 illustrate various stages of a semiconductor device fabrication process in accordance with other embodiments of the present disclosure. It is understood that additional operations can be provided before, during, and after processes shown by FIGS. 23-26, and some of the operations described below can be replaced or eliminated, for additional embodiments of the method. The order of the operations/processes may be interchangeable. Materials, configurations, processes and/or operations same as or similar to those explained with respect to FIGS. 1A-22 may be applied to the following embodiments, and the detailed explanation thereof may be omitted to avoid redundancy.

Figure 23:
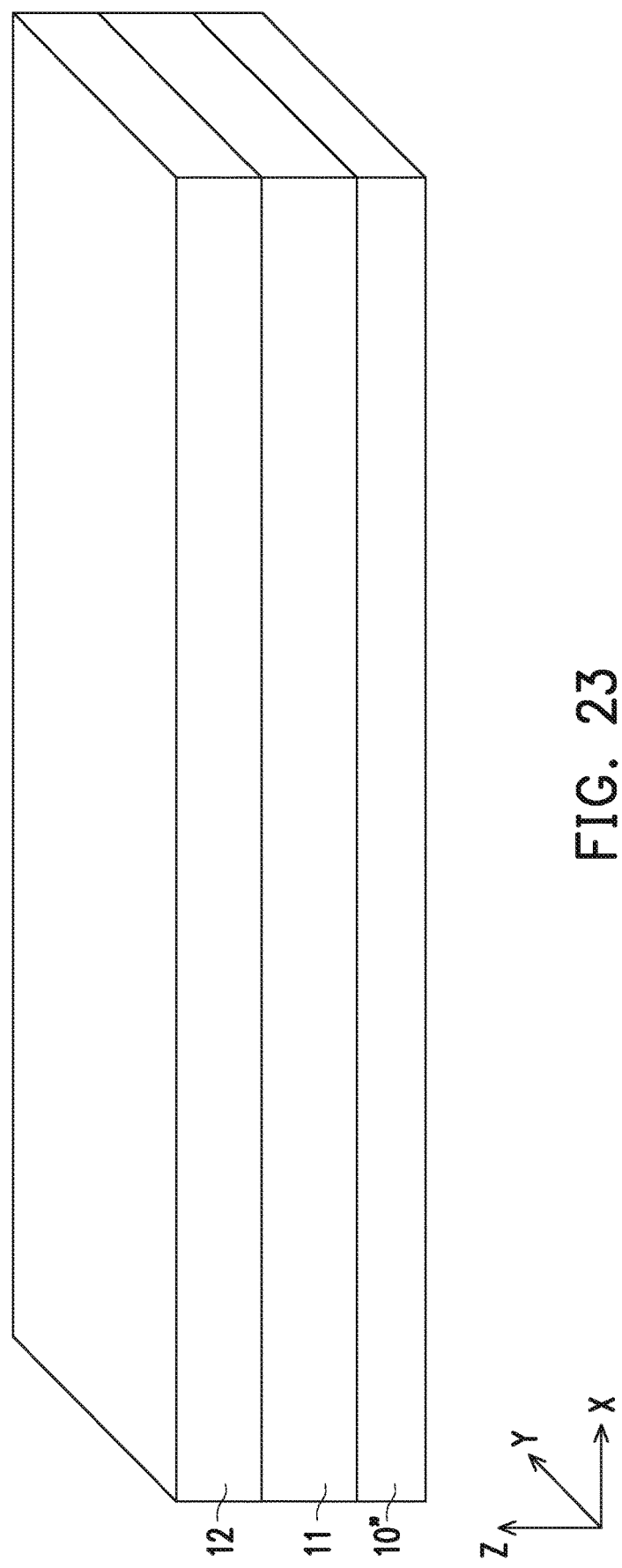
FIG. 23 illustrates one of the various stages in a semiconductor device fabrication process in accordance with other embodiments of the present disclosure.

As shown in FIG. 23, a first semiconductor layer 11 is epitaxially formed on a substrate 10" and a second semiconductor layer 12 is epitaxially formed on the first semiconductor layer 11. In some embodiments, the substrate 10" is Si, the first semiconductor layer 11 is made of SiGe, and the second semiconductor layer 12 is made of Si.

Figure 24:
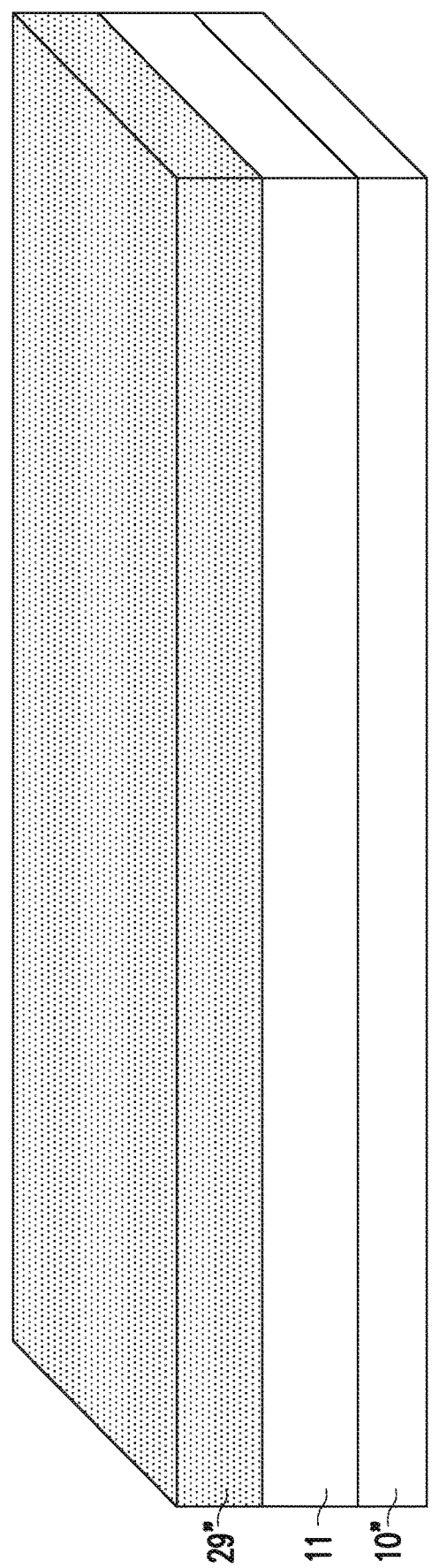
FIG. 24 illustrates one of the various stages in a semiconductor device fabrication process in accordance with other embodiments of the present disclosure.
Figure 25:
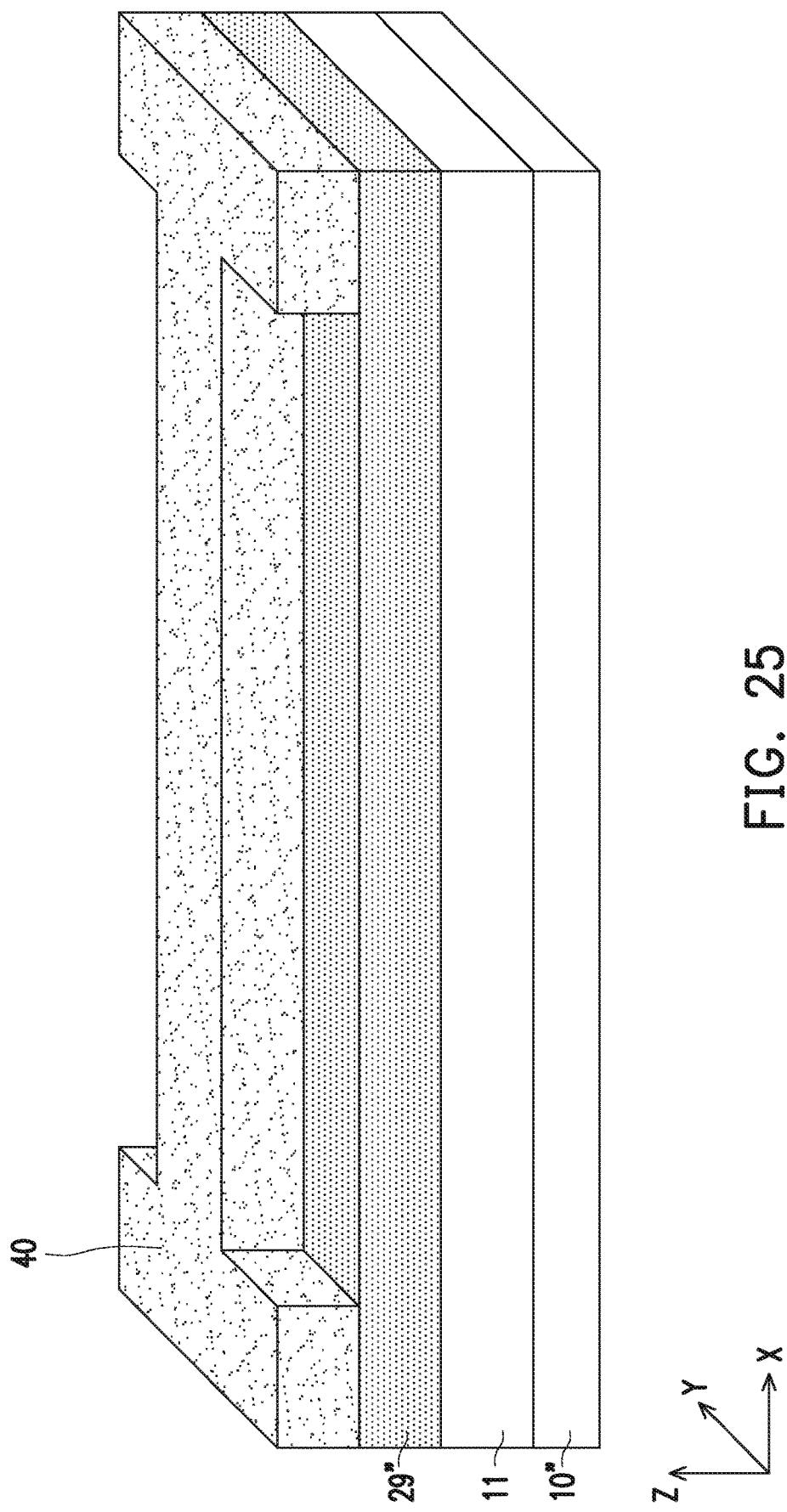
FIG. 25 illustrates one of the various stages in a semiconductor device fabrication process in accordance with other embodiments of the present disclosure.

Then, similar to the operations of FIG. 3, impurities are introduced in the second semiconductor layer 12, thereby forming a doped second semiconductor layer 29", as shown in FIG. 24. Similar to FIG. 4, a mask pattern 40 is formed over the doped second semiconductor layer 29", as shown in FIG. 25.

Figure 26:
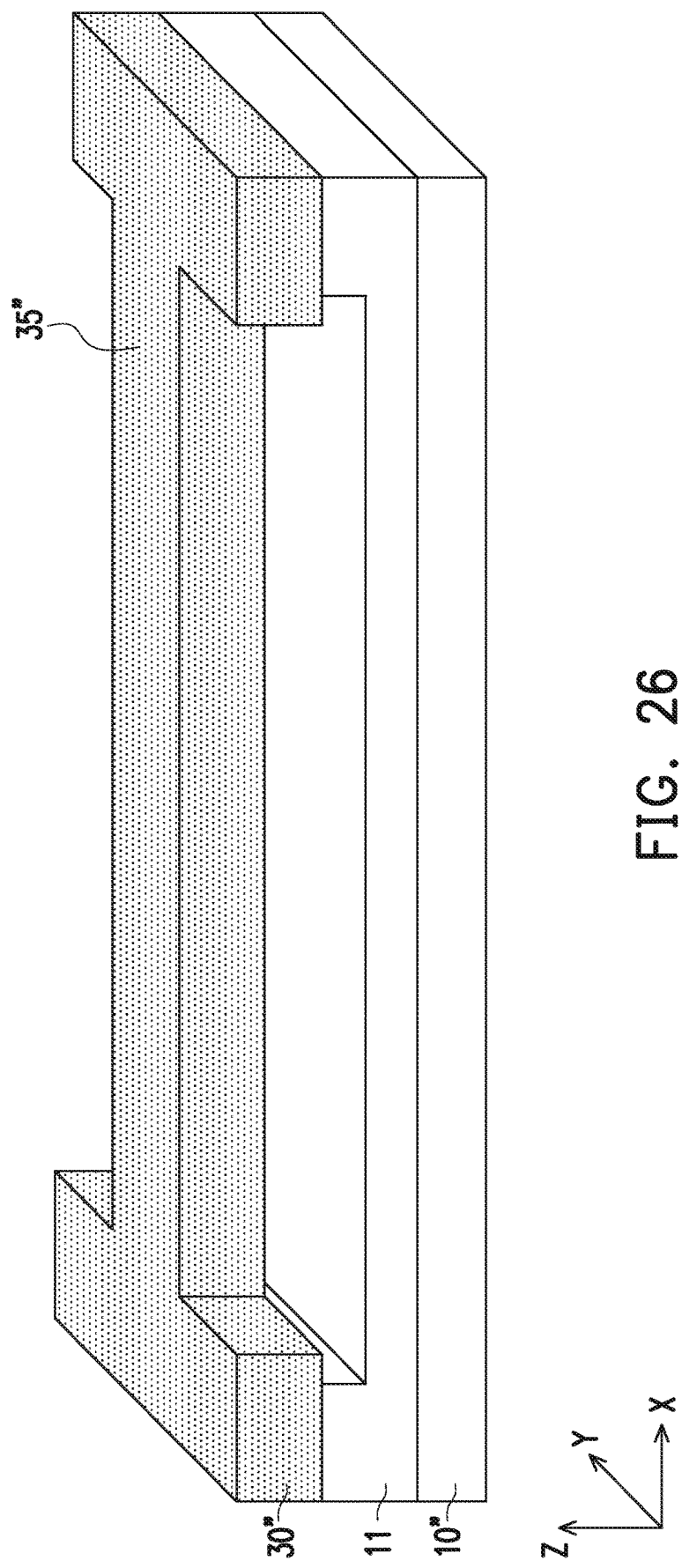
FIG. 26 illustrates one of the various stages in a semiconductor device fabrication process in accordance with other embodiments of the present disclosure.

Then, the doped second semiconductor layer 29" and the substrate 10" are etched to form the semiconductor wire 35" and anchor portions 30", as shown in FIG. 26. To form the semiconductor wire, the second semiconductor layer 12 is etched by using the mask pattern 40 as an etching mask, and then part of the first semiconductor layer 11 is removed. The first semiconductor layer 11 may be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution. Subsequently, the mask pattern 40 is removed.

In some embodiments, a protrusion similar to that shown in FIG. 20 may be formed under the semiconductor wire 35".

Subsequently, similar to FIG. 11, an insulating layer is formed in the recessed first semiconductor layer 11. In some embodiments, the first semiconductor layer under the semiconductor wire 35" is fully removed to expose the substrate 10". After the insulating layer is formed, the operations for forming the NVM cell structure as explained with FIGS. 6-16 are performed.

It will be understood that not all advantages have been necessarily discussed herein, no particular advantage is required for all embodiments or examples, and other embodiments or examples may offer different advantages.

For example, in the present disclosure, a 1.5 T-SONOS NVM cell having a select transistor and a control transistor is employed, which is easier to be scaled down compared with a NVM cell having a floating gate. Further, by employing a gate-all-around structure, it is possible to more precisely control the memory operation and to improve write/read/erase operations. In addition, it is possible to further reduce the device size.

In accordance with an aspect of the present disclosure, in a method of forming a semiconductor device including a non-volatile memory (NVM) cell, a semiconductor wire is formed over an insulating layer disposed on a substrate. A gate dielectric layer is formed wrapped around the semiconductor wire. A select gate electrode is formed around the semiconductor wire wrapped by the gate dielectric layer. A first stacked dielectric layer is formed around the semiconductor wire not covered by the select gate electrode and a second stacked dielectric layer is formed on the select gate electrode. A control gate electrode is formed around the semiconductor wire wrapped by the first stacked dielectric layer and adjacent to one face of the select gate electrode with the second stacked dielectric layer interposed therebetween. In one or more foregoing or following embodiments, the semiconductor wire is formed by forming a mask pattern on a semiconductor layer disposed on the insulating layer, patterning the semiconductor layer by using the mask pattern as an etching mask, and removing part of the insulating layer, thereby forming the semiconductor wire. In one or more foregoing or following embodiments, before forming the mask pattern, a doped layer is formed in the semiconductor layer by one or more ion implantation operations. In one or more foregoing or following embodiments, after the semiconductor wire is formed, one or more ion implantation operations are performed, thereby introducing impurities into the semiconductor wire. In one or more foregoing or following embodiments, the semiconductor wire is formed by forming a mask pattern on the substrate, etching the substrate, thereby forming a recess in the substrate and the semiconductor wire disposed over the recess, and forming the insulating layer in the recess. In one or more foregoing or following embodiments, before forming the mask pattern, a doped layer is formed in the substrate by one or more ion implantation operations. In one or more foregoing or following embodiments, after the semiconductor wire is formed, one or more ion implantation operations are performed, thereby introducing impurities into the semiconductor wire. In one or more foregoing or following embodiments, the first and second stacked dielectric layers include a first dielectric layer disposed on the control gate portion of the semiconductor wire, a second dielectric layer disposed on the first dielectric layer, and a third dielectric layer disposed on the second dielectric layer. In one or more foregoing or following embodiments, the second dielectric layer includes one or more materials selected from the group consisting of SiN, SiON, HfO$_2$, ZrO$_2$ and Si-dots. In one or more foregoing or following embodiments, after the control gate electrode is formed, the first stacked dielectric layer which is not covered by the select gate is removed.

In accordance with another aspect of the present disclosure, a semiconductor device including a non-volatile memory (NVM) cell. The NVM cell includes a semiconductor wire disposed over an insulating layer disposed on a substrate. The NVM cell includes a select transistor and a control transistor. The select transistor includes a gate dielectric layer disposed around the semiconductor wire and a select gate electrode disposed on the gate dielectric layer. The control transistor includes a first stacked dielectric layer disposed around the semiconductor wire and a control gate electrode disposed on the first stacked dielectric layer. The select gate electrode is disposed adjacent to the control gate electrode with a second stacked dielectric layer interposed therebetween. The first and second stacked dielectric layers include a charge trapping layer. In one or more foregoing or following embodiments, the first and second stacked dielectric layers further include a first dielectric layer made of oxide and a third dielectric layer made of oxide and disposed on the charge trapping layer, and the charge trapping layer is disposed on the first dielectric layer. In one or more foregoing or following embodiments, the charge trapping layer includes one or more materials selected from the group consisting of SiN, SiON, HfO$_2$, ZrO$_2$ and Si-dots. In one or more foregoing or following embodiments, a part of the gate dielectric layer is disposed between the select gate electrode and the insulating layer. In one or more foregoing or following embodiments, a part of the second stacked dielectric layer is disposed between the control gate electrode and the insulating layer. In one or more foregoing or following embodiments, a height of the control gate electrode is greater than a height of the select gate electrode.

In accordance with another aspect of the present disclosure, a semiconductor device includes a non-volatile memory (NVM) cell. The NVM cell includes a semiconductor wire disposed over an insulating layer disposed on a substrate. The NVM cell includes a first control transistor, a select transistor, a second select transistor and a second control transistor, which are arranged in this order along an extending direction of the semiconductor wire. The first and second select transistors include a gate dielectric layer disposed around the semiconductor wire and a select gate electrode disposed on the gate dielectric layer. The first and second control transistors include a first stacked dielectric layer disposed around the semiconductor wire and a control gate electrode disposed on the stacked dielectric layer. The first select gate electrode is disposed adjacent to the first control gate electrode with a second stacked dielectric layer interposed therebetween, and the second select gate electrode is disposed adjacent to the second control gate electrode with a third stacked dielectric layer interposed therebetween. The first to third stacked dielectric layers include a charge trapping layer. The semiconductor wire includes a shared drain portion disposed between the select gate electrode of the first select transistor and the select gate electrode of the second select transistor. In one or more foregoing or following embodiments, the first and second stacked dielectric layers further include a first dielectric layer made of an oxide and a third dielectric layer made of an oxide and disposed on the charge trapping layer, the charge trapping layer is disposed on the first dielectric layer, and the charge trapping layer includes one or more materials selected from the group consisting of SiN, SiON, HfO$_2$ and ZrO$_2$. In one or more foregoing or following embodiments, a part of the gate dielectric layer is disposed between the select gate electrode and the insulating layer, and a part of the second stacked dielectric layer is disposed between the control gate electrode and the insulating layer. In one or more foregoing or following embodiments, no portion of the gate dielectric layer is disposed between the first stacked dielectric layer and the control gate electrode.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    an insulating layer disposed over a substrate;
    a semiconductor wire disposed over the insulating layer;
    a first gate dielectric layer disposed around a first part of the semiconductor wire;
    a first gate electrode disposed on the first gate dielectric layer; and
    a first bottom dielectric layer disposed between the first gate electrode and the insulating layer, and
    each of the first gate dielectric layer and the first bottom dielectric layer include three dielectric layers.

2. The semiconductor device of claim 1, further comprising a side dielectric layer disposed on one side face of the first gate electrode layer and includes three dielectric layers.

3. The semiconductor device of claim 2, wherein the side dielectric layer including the three dielectric layer is not disposed on another side face opposite to the one side face of the first gate electrode.

4. The semiconductor device of claim 2, wherein the first gate dielectric layer, the first bottom dielectric layer and the side dielectric layer are continuous.

5. The semiconductor device of claim 2, further comprising:
    a second gate dielectric layer disposed around a second part of the semiconductor wire; and
    a second gate electrode disposed on the second gate dielectric layer,
    wherein the side dielectric layer is disposed between the second gate electrode and the first gate electrode.

6. The semiconductor device of claim 5, wherein the second gate dielectric layer has a different film configuration than the first gate dielectric layer.

7. The semiconductor device of claim 5, further comprising a second bottom dielectric layer disposed between the second gate electrode and the insulating layer,
    wherein the second gate dielectric layer and the second bottom dielectric layer are made of a same material.

8. The semiconductor device of claim 5, wherein a height of the first gate electrode is smaller than a height of the second gate electrode.

9. The semiconductor device of claim 1, wherein:
    the three dielectric layers includes a first layer made of oxide, a second layer made of one of SiN, SiON, HfO$_2$ and ZrO$_2$ and a third layer made of oxide.

10. A semiconductor device, comprising:
    an insulating layer disposed over a substrate;
    a semiconductor wire disposed over the insulating layer;
    a first gate dielectric layer disposed around a first part of the semiconductor wire;
    a first gate electrode disposed on the first gate dielectric layer;
    a second gate dielectric layer disposed around a second part of the semiconductor wire; and
    a second gate electrode disposed on the first gate dielectric layer,
    wherein the first gate dielectric layer is in contact with the second gate dielectric layer.

11. The semiconductor device of claim 10, wherein the first gate dielectric layer extends between a side of the first gate electrode and a side of the second gate electrode.

12. The semiconductor device of claim 11, wherein:
    the first gate dielectric layer includes a first layer disposed on the first part of the semiconductor wire, a second layer disposed on the first layer and a third layer disposed on the second layer, and the first layer extends beyond the first gate electrode and wraps around a third part of the semiconductor wire.

13. The semiconductor device of claim 12, wherein the first layer is disposed on a top face of the second gate electrode.

14. The semiconductor device of claim 13, wherein the first layer is disposed on a side face of the second gate electrode and wraps around a fourth part of the semiconductor wire.

15. A semiconductor device comprising:

an insulating layer disposed over a substrate;

a semiconductor wire disposed over the insulating layer;

a first gate dielectric layer disposed around a first part of the semiconductor wire;

a first gate electrode disposed on the first gate dielectric layer; and a protrusion protruding from the substrate and disposed just below the semiconductor wire, wherein the first gate dielectric layer includes a first layer made of oxide, a second layer made of one of SiN, SiON, $HfO_2$ and $ZrO_2$ and a third layer made of oxide.

16. The semiconductor device of claim 15, wherein the protrusion is embedded in the insulating layer.

17. The semiconductor device of claim 16, further comprising:

a second gate dielectric layer disposed around a second part of the semiconductor wire; and a second gate electrode disposed on the first gate dielectric layer, wherein the first gate dielectric layer extends between a side of the first gate electrode and a side of the second gate electrode.

18. The semiconductor device of claim 17, wherein no portion of the second gate dielectric layer is disposed between the first gate dielectric layer and the first gate electrode.

19. The semiconductor device of claim 17, wherein no portion of the first gate dielectric layer is disposed between the second gate dielectric layer and the second gate electrode.

20. The semiconductor device of claim 17, wherein:

a part of the first gate dielectric layer is disposed between the first gate electrode and the insulating layer, and a part of the second gate dielectric layer is disposed between the second gate electrode and the insulating layer.

* * * * *